(12) United States Patent
Jinta et al.

(10) Patent No.: US 9,287,333 B2
(45) Date of Patent: Mar. 15, 2016

(54) DISPLAY UNIT AND ELECTRONIC APPARATUS HAVING INSULATING LAYERS STACKED WITH DIFFERENT REFRACTIVE INDICES

(71) Applicant: Sony Corporation, Tokyo (JP)

(72) Inventors: Seiichiro Jinta, Kanagawa (JP); Jiro Yamada, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/192,950

(22) Filed: Feb. 28, 2014

(65) Prior Publication Data

US 2014/0306200 A1  Oct. 16, 2014

(30) Foreign Application Priority Data

Apr. 11, 2013  (JP) .................................. 2013-083276

(51) Int. Cl.
  *H01L 29/08*  (2006.01)
  *H01L 29/02*  (2006.01)
  *H01L 29/04*  (2006.01)
  *H01L 27/15*  (2006.01)
  *H01L 27/32*  (2006.01)

(52) U.S. Cl.
  CPC ........ *H01L 27/3218* (2013.01); *H01L 27/3246* (2013.01); *H01L 27/3213* (2013.01)

(58) Field of Classification Search
  CPC ............ H01L 27/3218; H01L 27/3246; H01L 27/3213

USPC ......... 257/40, 79, 59, 535; 362/327; 313/504; 438/285

See application file for complete search history.

(56) References Cited

U.S. PATENT DOCUMENTS

| | | | | |
|---|---|---|---|---|
| 5,396,350 | A * | 3/1995 | Beeson et al. | 349/62 |
| 5,920,080 | A * | 7/1999 | Jones | 257/40 |
| 2005/0116236 | A1* | 6/2005 | Park et al. | 257/79 |
| 2005/0259198 | A1* | 11/2005 | Lubart et al. | 349/113 |
| 2006/0038752 | A1* | 2/2006 | Winters | 345/76 |
| 2009/0079336 | A1* | 3/2009 | Yamada et al. | 313/504 |
| 2011/0163339 | A1* | 7/2011 | Negishi et al. | 257/98 |

FOREIGN PATENT DOCUMENTS

JP  2007-248484 A  9/2007

* cited by examiner

*Primary Examiner* — Long K Tran
*Assistant Examiner* — Dzung Tran
(74) *Attorney, Agent, or Firm* — Michael Best & Friedrich LLP

(57) ABSTRACT

A display unit includes a pixel including a plurality of sub-pixels. The sub-pixels each include a plurality of light emission regions that are arranged away from one another. Each of the sub-pixels includes a single first electrode, a single second electrode provided in a lamination direction of the first electrode, and a light-emitting layer inserted between the first electrode and the second electrode in each of the light emission regions.

19 Claims, 34 Drawing Sheets

DISPLAY UNIT AND ELECTRONIC APPARATUS HAVING INSULATING LAYERS STACKED WITH DIFFERENT REFRACTIVE INDICES

CROSS REFERENCE TO RELATED APPLICATIONS

This application claims the benefit of Japanese Priority Patent Application JP 2013-083276 filed on Apr. 11, 2013, the entire contents of which are incorporated herein by reference.

BACKGROUND

The present disclosure relates to a display unit having a current-drive type display device, and an electronic apparatus that includes such a display unit.

In recent years, in the field of a display unit that performs image display, a display unit (organic EL (Electroluminescence) display unit) has been developed that uses, as a light-emitting device, a current-drive type optical device in which the emission luminance varies depending on a value of a flowing current, such as an organic EL device, and the product commercialization of such a display unit has been carried forward. Unlike a liquid crystal device and the like, such a light-emitting device is a self-emitting device, which eliminates the necessity for providing a light source (backlight) separately. Therefore, the organic EL display unit has characteristics including the higher visibility of images, lower power consumption, and higher response speed of devices as compared with a liquid crystal display unit in which a light source is necessary.

In a display unit, the high image quality has been typically desired, and accordingly, various technologies for improving the image quality have been developed. For example, Japanese Unexamined Patent Application Publication No. 2007-248484 has disclosed a display unit that limits a viewing angle and enhances the front luminance in such a manner that a light guiding section is provided in front of each display device, and light is reflected on a side surface of the light guiding section. This display unit may be applicable to a mobile apparatus, for example, and improves the image quality by limiting a viewing angle by design, while enhancing the visibility at the time when images are viewed from the front.

SUMMARY

In an electronic apparatus, low power consumption has been typically desired, and reduction in the power consumption has been expected for a display unit as well.

It is desirable to provide a display unit and an electronic apparatus that are capable of reducing the power consumption.

According to an embodiment of the present disclosure, there is provided a display unit including a pixel including a plurality of sub-pixels. The sub-pixels each includes a plurality of light emission regions that are arranged away from one another. Each of the sub-pixels includes a single first electrode, a single second electrode provided in a lamination direction of the first electrode, and a light-emitting layer inserted between the first electrode and the second electrode in each of the light emission regions.

According to an embodiment of the present disclosure, there is provided an electronic apparatus provided with a display unit and a control section configured to control operation of the display unit. The display unit includes a pixel including a plurality of sub-pixels. The sub-pixels each includes a plurality of light emission regions that are arranged away from one another. Each of the sub-pixels includes a single first electrode, a single second electrode provided in a lamination direction of the first electrode, and a light-emitting layer inserted between the first electrode and the second electrode in each of the light emission regions. Examples of such an electronic apparatus may include a television apparatus, a digital camera, a personal computer, a video camera, or a mobile terminal apparatus including a mobile phone.

In the display unit and the electronic apparatus according to the above-described embodiments of the present disclosure, the plurality of light emission regions that are arranged to be away from one another are formed in each of the sub-pixels. Each of the sub-pixels has the single first electrode and the single second electrode, and the light-emitting layer is inserted between the first electrode and the second electrode in correspondence with each of the light emission regions.

According to the display unit and the electronic apparatus in the above-described embodiments of the present disclosure, each of the sub-pixels is provided with the plurality of light emission regions that are arranged to be away from one another, which makes it possible to reduce the power consumption.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Figure 1:
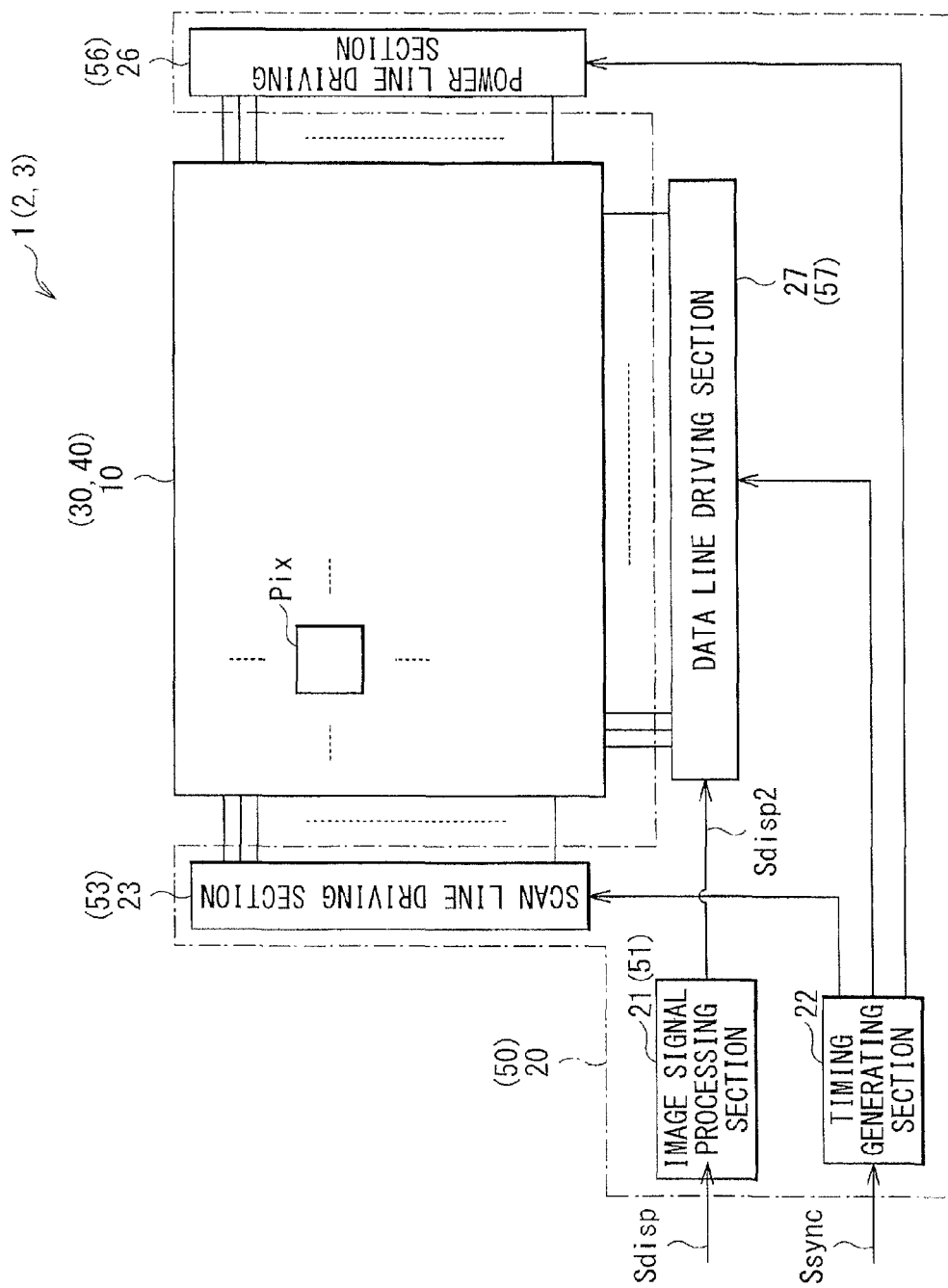
FIG. 1 is a block diagram showing an example of a configuration of a display unit according to an embodiment of the present disclosure.

Hereinafter, some embodiments of the present disclosure are described in details with reference to the drawings. It is to be noted that the description is provided in the order given below.
1. First Embodiment
2. Second Embodiment
3. Third Embodiment
4. Application Examples 1. First Embodiment Example of Configuration FIG. 1 shows an example of a configuration of a display unit according to an embodiment of the present disclosure. A display unit 1 is an active matrix type display unit using organic EL devices.

The display unit 1 includes a display section 10 and a driving section 20. The driving section 20 has an image signal processing section 21, a timing generating section 22, a scan line driving section 23, a power line driving section 26, and a data line driving section 27.

The display section 10 is configured in such a manner that a plurality of pixels Pix are arranged in a matrix pattern. As described below, the pixel Pix is configured of four sub-pixels 11 of red, green, blue, and white.

Figure 2:
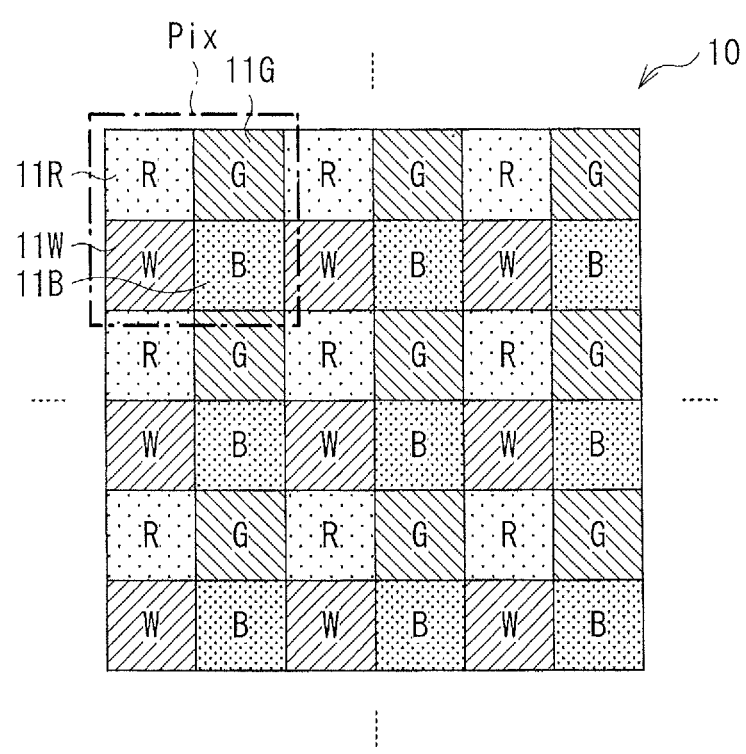
FIG. 2 is a schematic diagram showing an arrangement of sub-pixels in a display section according to a first embodiment of the present disclosure.

FIG. 2 shows an example of an arrangement of the sub-pixels 11 in the display section 10. Each of the pixels Pix has four sub-pixels 11R, 11G, 11B, and 11W of red (R), green (G), blue (B), and white (W), respectively. In this example, these four sub-pixels 11R, 11G, 11B, and 11W are arranged in an array of two rows and two columns in the pixel Pix. More specifically, in the pixel Pix, the sub-pixel 11R of red (R), the sub-pixel 11G of green (G), the sub-pixel 11W of white (W), and the sub-pixel 11B of blue (B) are arranged at the upper left, at the upper right, at the lower left, and at the lower right, respectively. It is to be noted that an arrangement of the four sub-pixels 11R, 11G, 11B, and 11W may preferably conform to such an arrangement. However, it is not limited thereto, and any other arrangements may be adopted alternatively.

Figure 3:
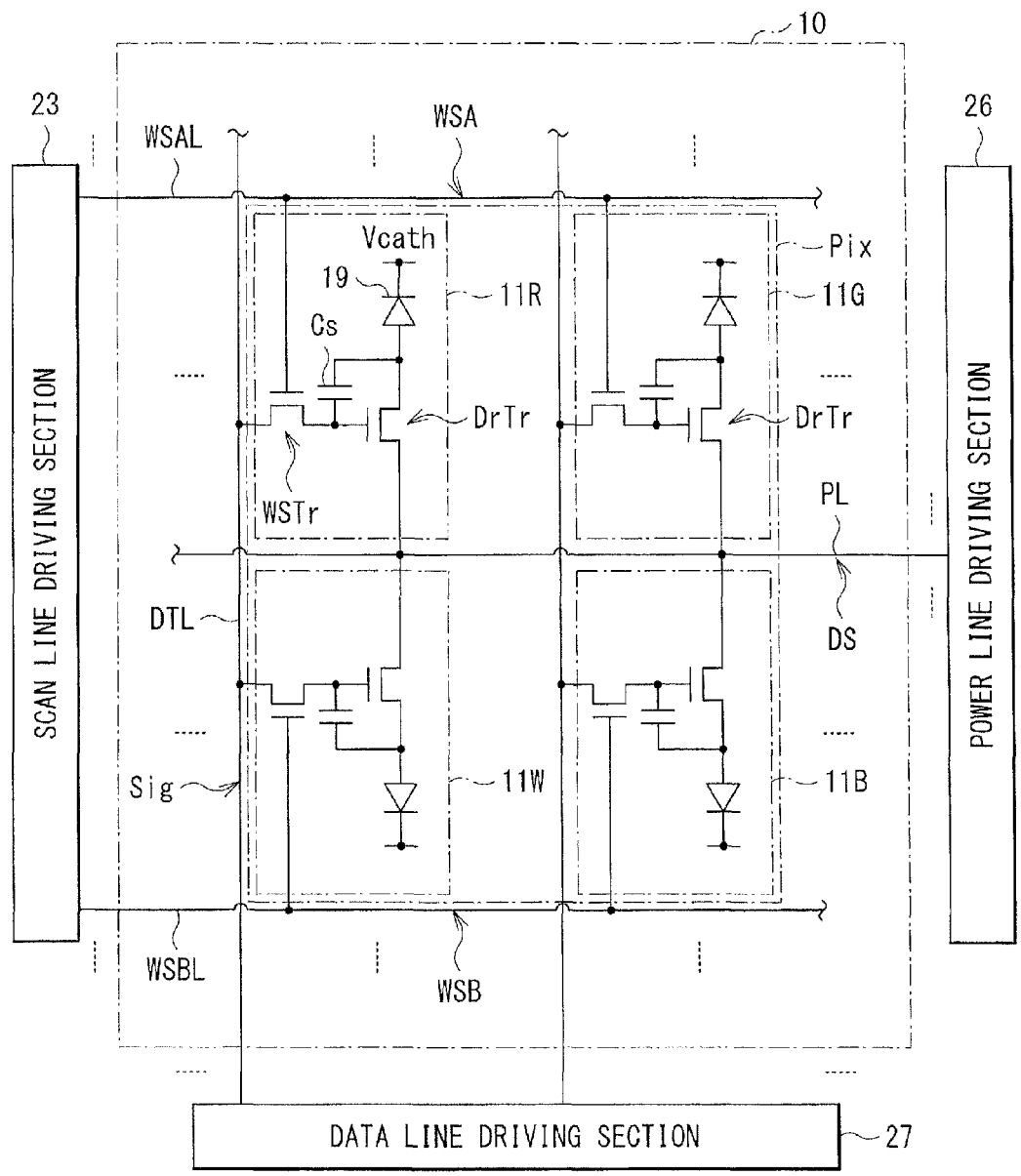
FIG. 3 is a circuit diagram showing an example of a configuration of the display section illustrated in FIG. 2.

FIG. 3 shows an example of a circuit configuration of the display section 10. The display section 10 has a plurality of scan lines WSAL and WSBL, as well as a plurality of power lines PL that extend in a row direction, and a plurality of data lines DTL that extend in a column direction. One end of each of the scan lines WSAL and WSBL is connected with the scan line driving section 23, and one end of the power line PL is connected with the power line driving section 26, while one end of the data line DTL is connected with the data line driving section 27. The sub-pixel 11R and the sub-pixel 11G that belong to one pixel Pix are connected with the same scan line WSAL, and the sub-pixel 11B and the sub-pixel 11W that belong to one pixel Pix are connected with the same scan line WSBL. Further, the sub-pixel 11R and the sub-pixel 11W that belong to one pixel Pix are connected with the same data line DTL, and the sub-pixel 11G and the sub-pixel 11B that belong to one pixel Pix are connected with the same data line DTL. Additionally, the four sub-pixels 11R, 11G, 11B, and 11W that belong to one pixel Pix are connected with the same power line PL.

Next, description is provided on a circuit configuration of the sub-pixels 11 by taking the sub-pixel 11R as an example. It is to be noted that the same is applicable to the circuit configurations of the sub-pixels 11G, 11B, and 11W.

The sub-pixel 11R includes a writing transistor WSTr, a driving transistor DRTr, a capacitor Cs, and a light-emitting device 19. Each of the writing transistor WSTr and the driving transistor DRTr may be configured of, for example, an N-channel MOS (Metal Oxide Semiconductor) TFT (Thin-Film Transistor). In the sub-pixel 11R, a gate of the writing transistor WSTr is connected with the scan line WSAL, a source thereof is connected with the data line DTL, and a drain thereof is connected with a gate of the driving transistor DRTr and a first end of the capacitor Cs. The gate of the driving transistor DRTr is connected with the drain of the writing transistor WSTr and the first end of the capacitor Cs, a drain thereof is connected with the power line PL, and a source thereof is connected with a second end of the capacitor Cs and an anode of the light-emitting device 19. The first end of the capacitor Cs is connected with the gate of the driving transistor DRTr and the drain of the writing transistor WSTr, and the second end thereof is connected with the source of the driving transistor DRTr and the anode of the light-emitting device 19. The light-emitting device 19 is a light-emitting device that is configured using the organic EL device to emit light of red (R), wherein the anode thereof is connected with the source of the driving transistor DRTr and the second end of the capacitor Cs, and a cathode voltage Vcath is supplied to a cathode thereof from the driving section 20.

Figure 4:
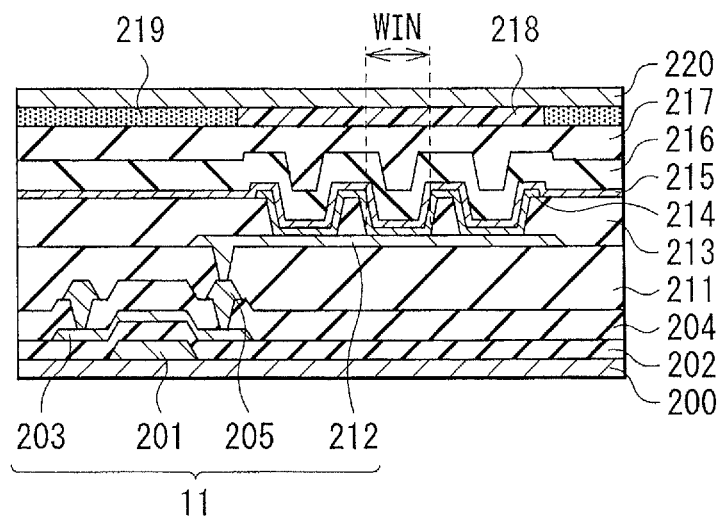
FIG. 4 is a cross-sectional view showing a simplified cross-sectional structure of the display section illustrated in FIG. 2.

FIG. 4 shows a cross-sectional view of the display section 10. The display section 10 has a substrate 200, a gate 201, a polysilicon 203, an anode 212, an insulating layer 213, a light-emitting layer 214, a cathode 215, an insulating layer 216, and a color filter 218.

The substrate 200 is a support substrate for the display section 10, and may be configured of, for example, a glass or plastic material, or the like. On the substrate 200, the gate 201 is formed. This gate 201 may be configured of, for example, a material such as molybdenum (Mo). On the substrate 200 and the gate 201, an insulating layer 202 is formed. This insulating layer 202 may be configured of, for example, a material such as silicon oxide ($SiO_2$) and silicon nitride (SiNx). On the insulating layer 202, the polysilicon 203 is formed in a region corresponding to the gate 201. The gate 201 and the polysilicon 203 configure the driving transistor DRTr and the like. It is to be noted that, in this example, the transistors are configured in a so-called bottom-gate structure in which the polysilicon 203 is formed above the gate 201. However, the configuration is not limited thereto, and the transistors may be alternatively configured in a so-called top-gate structure in which the polysilicon is formed below the gate. On the polysilicon 203 and the insulating layer 202, an insulating layer 204 is formed. This insulating layer 204 may be configured of, for example, a material similar to that of the insulating layer 202. Further, at a part of a region where the polysilicon 203 is formed, a contact/wiring 205 is formed to run through the insulating layer 204. The wiring 205 may be configured of, for example, three layers of titanium (Ti)/aluminum (Al)/titanium (Ti).

On the insulating layer 204, an insulating layer 211 is formed. The insulating layer 211 may be configured of, for example, a material such as polyimide and acrylic resin. On the insulating layer 211, an anode 212 is formed. The anode 212 is connected with the contact/wiring 205 related to the source of the driving transistor DRTr in a manner of running through the insulating layer 211. The anode 212 may be configured of, for example, a material such as ITO/Al alloy, Al alloy, ITO/Ag, and ITO/Ag alloy. In other words, the anode 212 may desirably have a property of reflecting light. On the anode 212 and the insulating layer 211, the insulating layer 213 is formed. The insulating layer 213 may be configured of, for example, a material similar to that of the insulating layer 211. On this insulating layer 213, a plurality of windows WIN are provided at a part of a region where the anode 212 is formed. On the anode 212 and the insulating layer 213, the light-emitting layer 214 is formed to cover the plurality of windows WIN. The light-emitting layer 214 is an organic EL layer that emits light of red, green, blue, and white. More specifically, the light-emitting layer 214 that emits light of red (R) is formed in a region corresponding to the sub-pixel 11R, the light-emitting layer 214 that emits light of green (G) is formed in a region corresponding to the sub-pixel 11G, the light-emitting layer 214 that emits light of blue (B) is formed in a region corresponding to the sub-pixel 11B, and the light-emitting layer 214 that emits light of white (W) is formed in a region corresponding to the sub-pixel 11W. On the insulating layer 213 and the light-emitting layer 214, the cathode 215 is formed with uniformity. The cathode 215 is a transparent or semi-transparent electrode, and may be configured of, for example, a material such as magnesium silver (MgAg) and IZO (registered trademark). In a case where the cathode 215 is made of the magnesium silver, it is possible to configure the semi-transparent cathode 215 by setting a film thickness in the order of several nanometers, for example. In a case where the cathode 215 is made of the IZO, the cathode 215 may be desirably formed with a film thickness within a range of several dozen to several thousand nanometers, for example. More specifically, the IZO is a transparent material, and thus it is possible to form the IZO with a slightly larger thickness to achieve a desirable low sheet resistance. On the cathode 215, the insulating layer 216 is formed in this example. The insulating layer 216 may be configured of, for example, a material such as silicon nitride (SiNx). The insulating layer 216 is made of a material the refractive index of which is different from the refractive index of the insulating layer 213. In concrete terms, as described hereinafter, the refractive indices of the insulating layers 213 and 216 are set to ensure that light incoming from the side of the insulating layer 216 is reflected at a pitched section PS of the insulating layer 213 that surrounds the windows WIN. Further, the insulating layer 216 also has a function to prevent variations in the characteristics such as light emission efficiency that may be caused by intrusion of moisture into the light-emitting layer 214. This insulating layer 216 is attached to a substrate 220 on which the color filter 218 and a black matrix 219 are formed on a surface with an insulating layer 217 that is a resin layer for sealing in between. More specifically, the color filter 218 of red (R) is formed in a region corresponding to the sub-pixel 11R, the color filter 218 of green (G) is formed in a region corresponding to the sub-pixel 11G, the color filter 218 of blue (B) is formed in a region corresponding to the sub-pixel 11B, and the color filter 218 of white (W) is formed in a region corresponding to the sub-pixel 11W.

With such a configuration, the light of red, green, blue, and white that is emitted from the light-emitting layer 214 travels in the opposite direction of the substrate 200 that is a support substrate. In other words, the light-emitting device 19 is a so-called top-emission type light-emitting device. The light that is emitted from the light-emitting device 19 is output from the display surface via the color filter 218. More specifically, a color gamut for light of red (R) is adjusted by the color filter 218 of red (R) at the sub-pixel 11R, a color gamut for light of green (G) is adjusted by the color filter 218 of green (G) at the sub-pixel 11G, a color gamut for light of blue (B) is adjusted by the color filter 218 of blue (B) at the sub-pixel 11B, and a color gamut for light of white (W) is adjusted by the color filter 218 of white (W) at the sub-pixel 11W. It is to be noted that these color filters 218 may not be provided in applications and the like where demanding requirements for the image quality (color gamut) are not so high.

Figure 5:
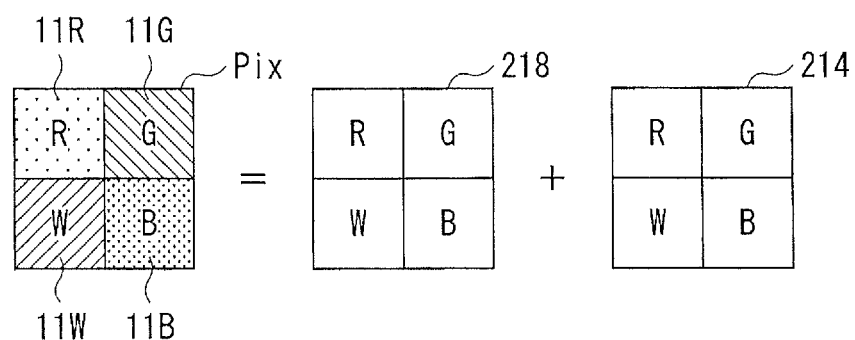
FIG. 5 is an explanatory diagram showing a configuration of the sub-pixels in the display section illustrated in FIG. 2.

FIG. 5 schematically shows a configuration of the four sub-pixels 11 in the pixel Pix. At the sub-pixel 11R of red (R), the red light that is emitted from the red light-emitting layer 214 passes through the red color filter 218. In a similar manner, the green light that is emitted from the green light-emitting layer 214 passes through the green color filter 218 at the sub-pixel 11G of green (G), the blue light that is emitted from the blue light-emitting layer 214 passes through the blue color filter 218 at the sub-pixel 11B of blue (B), and the white light that is emitted from the white light-emitting layer 214 passes through the white color filter 218 at the sub-pixel 11W of white (W).

Figure 6:
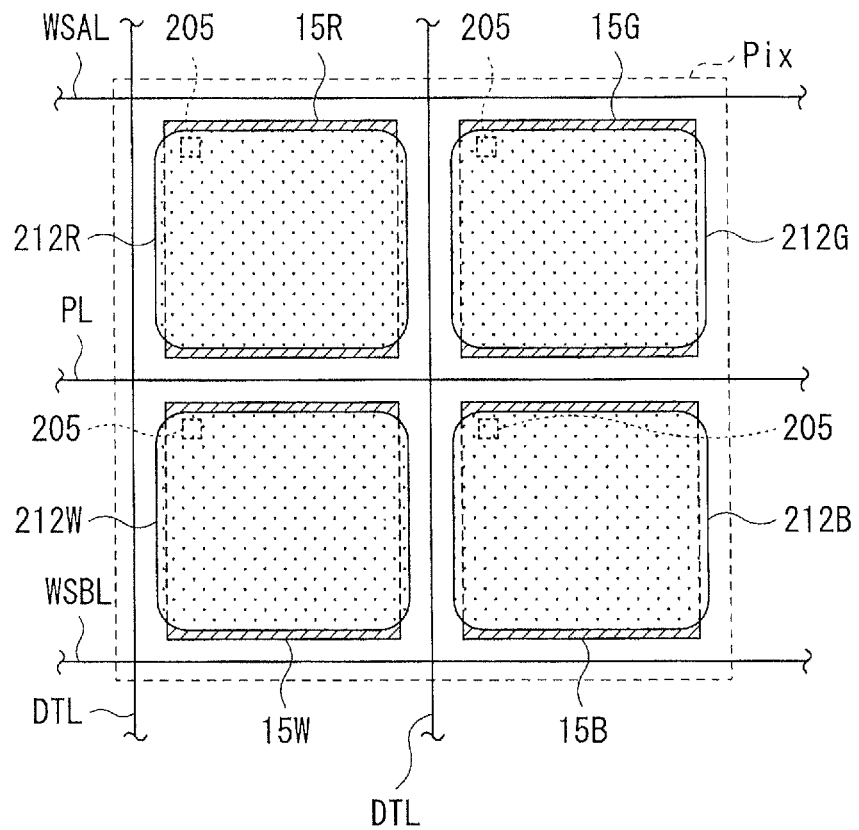
FIG. 6 is a plan view showing an example of an arrangement of anodes in the display section illustrated in FIG. 2.

FIG. 6 shows an arrangement of the anodes 212 in the pixel Pix. The pixel Pix is provided with four circuit regions 15R, 15G, 15B, and 15W, as well as four anodes 212R, 212G, 212B, and 212W.

The circuit region 15R is a region where the devices (the writing transistor WSTr, the driving transistor DRTr, and the capacitor Cs) other than the light-emitting device 19 in the sub-pixel 11R are arranged. Similarly, the circuit region 15G is a region where the devices other than the light-emitting device 19 in the sub-pixel 11G are arranged, the circuit region 15B is a region where the devices other than the light-emitting device 19 in the sub-pixel 11B are arranged, and the circuit region 15W is a region where the devices other than the light-emitting device 19 in the sub-pixel 11W are arranged. In this example, a layout for each of the circuit regions 15R, 15G, 15B, and 15W is almost the same except for portions for connection with the scan lines WSAL and WSBL, as well as the power line PL. It is to be noted that the layout of these circuit regions is not limited thereto, and for example, the layout of the circuit regions 15R and 15G may be an inversion of the layout of the circuit regions 15B and 15W in an upside-down manner, or alternatively each of the circuit regions may be arranged in the layout quite different from one another. As described above, by reusing the same layout in a rotating or inverting manner, it is possible to improve the efficiency of a layout work.

The anodes 212R, 212G, 212B, and 212W are anodes in the sub-pixels 11R, 11G, 11B, and 11W, respectively. Each of these anodes 212R, 212G, 212B, and 212W is connected with the source of the driving transistor DRTr that is formed at each of the circuit regions 15R, 15G, 15B, and 15W via the contact 205. In this example, the contacts 205 have square shapes, and are arranged at the upper left of the anodes 212R, 212G, 212B, and 212W.

Figure 7:
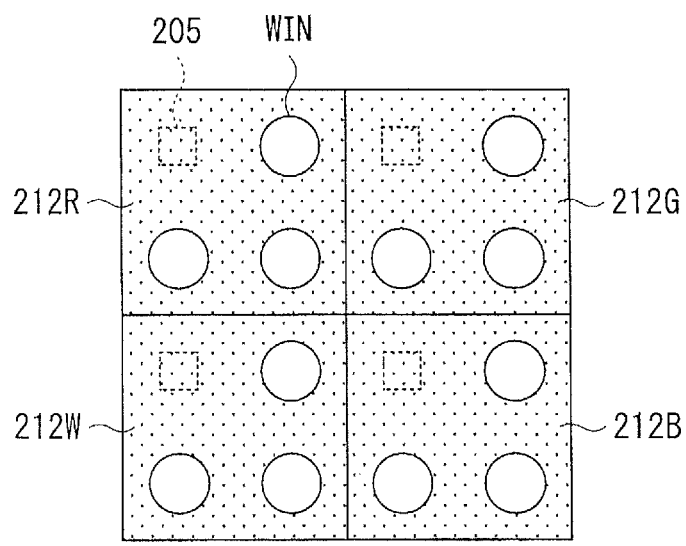
FIG. 7 is a plan view showing an example of an arrangement of windows in the display section illustrated in FIG. 2.

FIG. 7 schematically shows an arrangement of the windows WIN in each of the anodes 212. Each of the anodes 212R, 212G, 212B, and 212W is formed away from one another as shown in FIG. 6. However, FIG. 7 illustrates these anodes that are placed adjacent to one another for the sake of explanatory convenience. In this example, three windows WIN are arranged at each of the regions of the anodes 212R, 212G, 212B, and 212W. The window WIN has the circular shape in this example. In this example, such three windows WIN are arranged at the upper right, lower left, and lower right in each of the anodes 212R, 212G, 212B, and 212W. More specifically, each of the three windows WIN is formed at a position different from a position where the contact 205 is formed.

Figure 8:
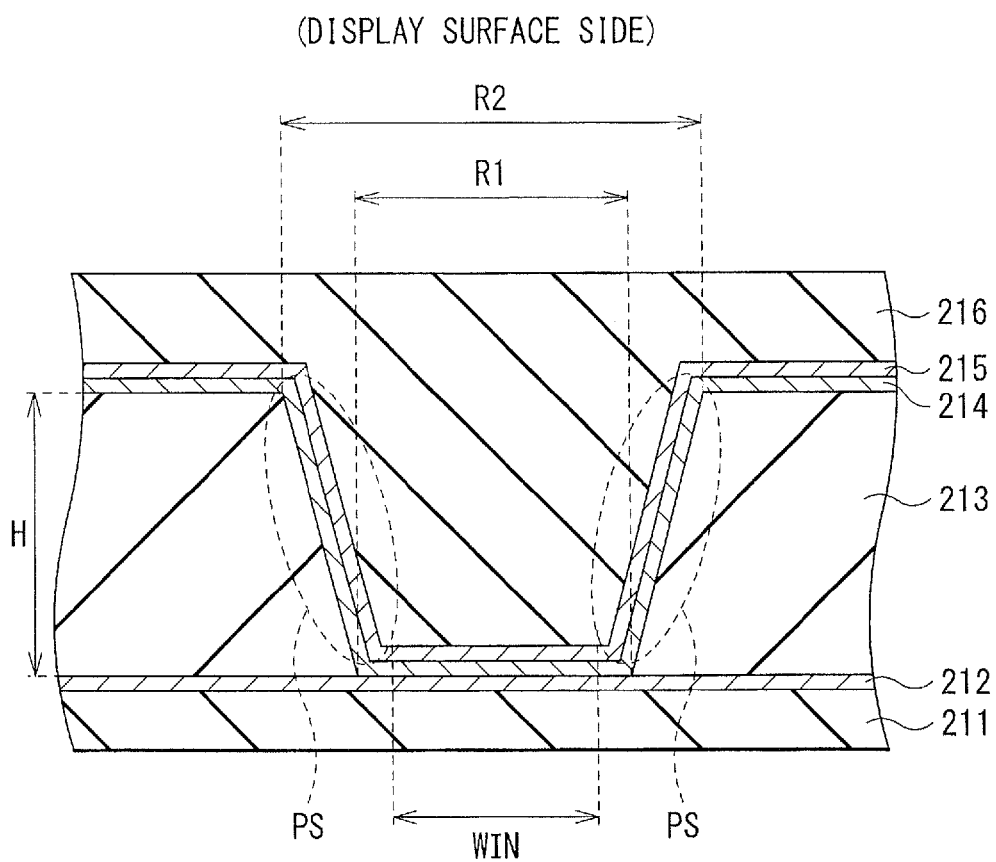
FIG. 8 is a cross-sectional view showing an example of a configuration of the window illustrated in FIG. 7.

FIG. 8 shows a cross-sectional structure of a main part of the window WIN. The insulating layer 213 is formed having a thickness with a height H, and a diameter R1 on the anode electrode 212 side is smaller than a diameter R2 on the display surface side in a window section of the insulating layer 213. In other words, on the insulating layer 213, there are provided the pitched sections PS in a manner of surrounding the window WIN. Consequently, as described hereinafter, the light that is emitted from the light-emitting layer 214 in the window WIN to move on to the pitched sections PS is reflected on the pitched sections PS to travel in the front direction of the display surface because of a difference in the refractive index between the insulating layer 213 and the insulating layer 216. As a result, this makes it possible to improve the efficiency in extracting the light to the outside in the display section 10.

It is to be noted that the windows WIN are provided at predetermined spacing intervals as shown in FIG. 7, and this is because there are provided the pitched sections PS as shown in FIG. 8. More specifically, circles each having the diameter R2 including the window WIN and the pitched sections PS are arranged at the predetermined spacing intervals that are defined by a design rule to avoid overlapping with one another.

In FIG. 1, etc., the image signal processing section 21 performs a predetermined processing operation, such as RGB-to-RGBW signal conversion and gamma conversion, on an image signal Sdisp that is provided from the outside to generate an image signal Sdisp2.

The timing generating section 22 is a circuit that provides a control signal to each of the scan line driving section 23, the power line driving section 26, and the data line driving section 27, and controls these circuit sections to operate in synchronization with one another on the basis of a synchronization signal Ssync that is provided from the outside.

The scan line driving section 23 applies scan signals WSA sequentially to the plurality of scan lines WSAL, and applies scan signals WSB sequentially to the plurality of scan lines WSBL, in accordance with the control signal that is provided from the timing generating section 22, thereby selecting the sub-pixels 11 sequentially.

The power line driving section 26 applies power signals DS sequentially to the plurality of power lines PL in accordance with the control signal that is provided from the timing generating section 22 to control light emission operation and light extinction operation of the sub-pixels 11. The power signal DS makes a transition between a voltage Vccp and a voltage Vini. As described hereinafter, the voltage Vini is a voltage for initializing the sub-pixels 11, and the voltage Vccp is a voltage for allowing the light-emitting device 19 to emit light by passing a current through the driving transistor DRTr.

The data line driving section 27 generates a signal Sig including a pixel voltage Vsig instructing the light-emitting luminance of each of the sub-pixels 11 and a voltage Vofs for performing Vth correction to be hereinafter described, in accordance with the image signal Sdisp2 that is provided from the image signal processing section 21 and the control signal that is provided from the timing generating section 22 to apply such a generated signal to each of the data lines DTL.

With such a configuration, as described hereinafter, the driving section 20 carries out a correction (Vth correction and μ (mobility) correction) for suppressing an influence of device variations in the driving transistor DRTr on the image quality for the sub-pixels 11, and writes the pixel voltage Vsig to the sub-pixels 11. Thereafter, the light-emitting device 19 in each of the sub-pixels 11 emits light with the luminance corresponding to the written pixel voltage Vsig.

Here, the anode 212 corresponds to a specific but not limitative example of a "first electrode" in one embodiment of the present disclosure. The cathode 215 corresponds to a specific but not limitative example of a "second electrode" in one embodiment of the present disclosure. The insulating layer 213 corresponds to a specific but not limitative example of a "first insulating layer" in one embodiment of the present disclosure. The insulating layer 216 corresponds to a specific but not limitative example of a "second insulating layer" in one embodiment of the present disclosure. The data line DTL corresponds to a specific but not limitative example of a "signal line" in one embodiment of the present disclosure. The circuit region 15 corresponds to a specific but not limitative example of a "pixel circuit region" in one embodiment of the present disclosure.

[Operation and Function]

Next, description is provided on operation and function of the display unit 1 according to this embodiment of the present disclosure.

(Overview of Overall Operation)

First, with reference to FIG. 1, description is provided on an overview of an overall operation of the display unit 1. The image signal processing section 21 performs a predetermined processing operation on the image signal Sdisp that is provided from the outside to generate the image signal Sdisp2. The timing generating section 22 provides a control signal to each of the scan line driving section 23, the power line driving section 26, and the data line driving section 27, and controls these circuit sections to operate in synchronization with one another, on the basis of the synchronization signal Ssync that is provided from the outside. The scan line driving section 23 applies the scan signals WSA sequentially to the plurality of scan lines WSAL, and applies the scan signals WSB sequentially to the plurality of scan lines WSBL in accordance with the control signal that is provided from the timing generating section 22, thereby selecting the sub-pixels 11 sequentially. The power line driving section 26 applies the power signals DS sequentially to the plurality of power lines PL in accordance with the control signal that is provided from the timing generating section 22 to control light emission operation and light extinction operation of the sub-pixels 11. The data line driving section 27 generates the signal Sig including the pixel voltage Vsig corresponding to the luminance of each of the sub-pixels 11 and the voltage Vofs for performing Vth correction, in accordance with the image signal Sdisp2 that is provided from the image signal processing section 21 and the control signal that is provided from the timing generating section 22 to apply such a generated signal to each of the data lines DTL. The display section 10 performs display in accordance with the scan signals WSA and WSB, as well as the power signal DS, and the signal Sig that are provided from the driving section 20.

(Detailed Operation)

Next, description is provided on the detailed operation of the display unit 1 by taking, as an example, two sub-pixels 11R and 11W that belong to one pixel Pix.

Figure 9:
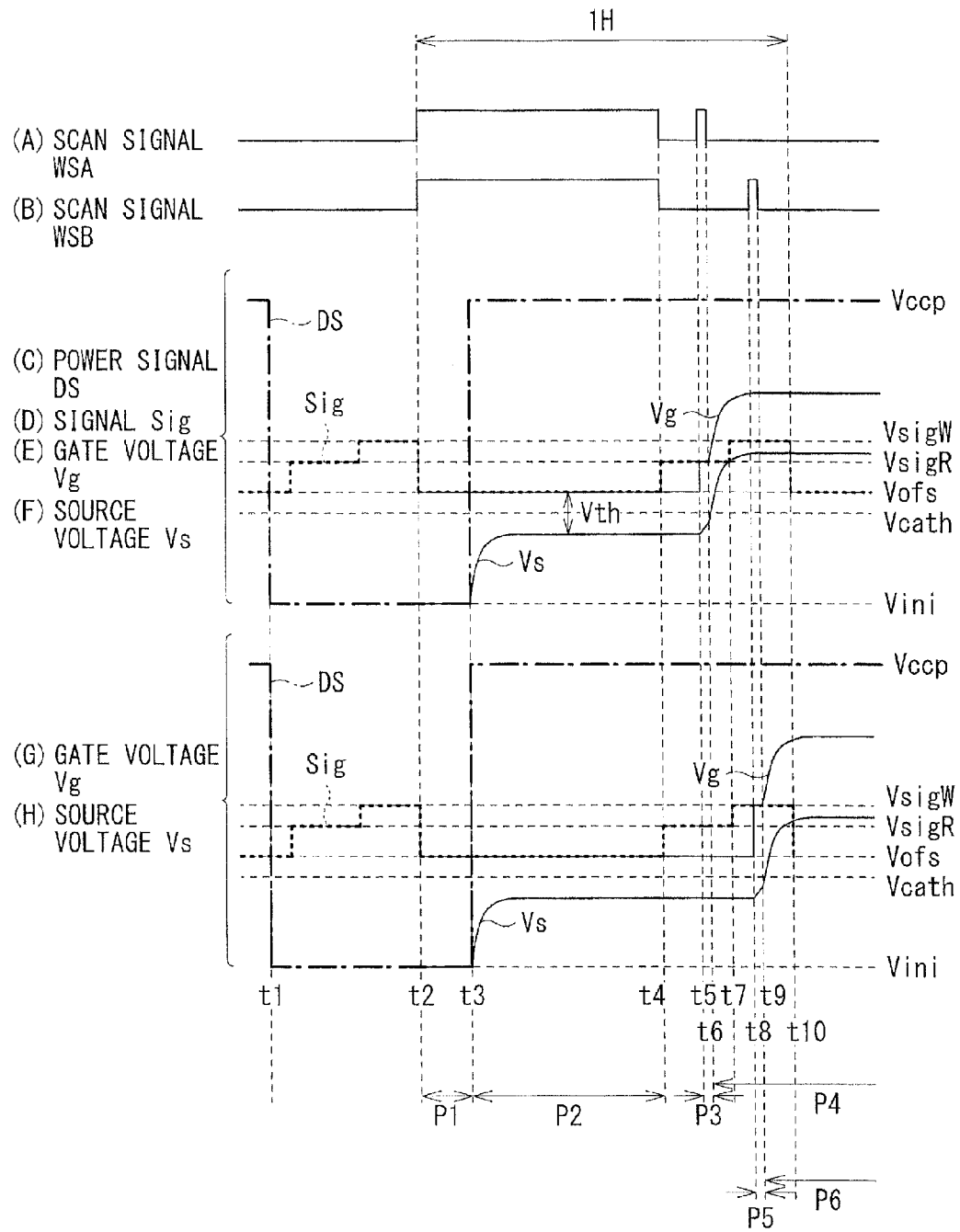
FIG. 9 is a timing waveform chart showing an example of operation of the display unit illustrated in FIG. 2.

FIG. 9 shows a timing chart for operation of the sub-pixels 11R and 11W, wherein (A) shows a waveform of the scan signal WSA, (B) shows a waveform of the scan signal WSB, (C) shows a waveform of the power signal DS, (D) shows a waveform of the signal Sig, (E) shows a waveform of a gate voltage Vg of the driving transistor DRTr in the sub-pixel 11R, (F) shows a waveform of a source voltage Vs of the driving transistor DRTr in the sub-pixel 11R, (G) shows a waveform of the gate voltage Vg of the driving transistor DRTr in the sub-pixel 11W, and (H) shows a waveform of the source voltage Vs of the driving transistor DRTr in the sub-pixel 11W. Each of (C) to (F) of FIG. 9 shows a waveform using the same voltage axis, and similarly, each of (G) and (H) of FIG. 9 shows a waveform using the same voltage axis. It is to be noted that, for the sake of explanatory convenience, the same waveforms as those of the power signal DS ((C) of FIG. 9) and the signal Sig ((D) of FIG. 9) are shown on the same voltage axis as in (G) and (H) of FIG. 9.

The driving section 20 initializes the sub-pixels 11R and 11W within one horizontal period (1H) (initialization period P1), and performs the Vth correction for suppressing an influence of device variations in the driving transistor DRTr on the image quality (Vth correction period P2). Subsequently, the driving section 20 writes a pixel voltage VsigR to the sub-pixel 11R, and performs the μ (mobility) correction that is different from the Vth correction (writing and μ correction period P3), and the light-emitting device 19 in the sub-pixel 11R emits light with the luminance corresponding to the written pixel voltage VsigR (light-emitting period P4). Thereafter, in a similar manner, the driving section 20 writes a pixel voltage VsigW to the sub-pixel 11W, and performs the μ (mobility) correction (writing and μ correction period P5), and the light-emitting device 19 in the sub-pixel 11W emits light with the luminance corresponding to the written pixel voltage VsigW (light-emitting period P6). Hereinafter, the details are described.

First, the power line driving section 26 changes the power signal DS from the voltage Vccp to the voltage Vini at a timing t1 prior to the initialization period P1 ((C) of FIG. 9). This turns on the driving transistor DRTr in each of the sub-pixels 11R and 11W, resulting in the source voltage Vs of each of the driving transistors DRTr being set at the voltage Vini ((F) and (H) of FIG. 9).

Next, the driving section 20 initializes the sub-pixels 11R and 11W during a timing period of t2 to t3 (initialization period P1). More specifically, at the timing t2, the data line driving section 27 sets the signal Sig at the voltage Vofs ((D) of FIG. 9), and the scan line driving section 23 changes a voltage of each of the scan signals WSA and WSB from a low level to a high level ((A) and (B) of FIG. 9). This turns on the writing transistor WSTr in each of the sub-pixels 11R and 11W, resulting in the gate voltage Vg of the driving transistors DRTr in each of the sub-pixels 11R and 11W being set at the voltage Vofs ((E) and (G) of FIG. 9). In such a manner, a gate-source voltage Vgs (=Vofs−Vini) of the driving transistor DRTr in each of the sub-pixels 11R and 11W is set at a voltage greater than the threshold voltage Vth of the driving transistor DRTr, leading to the initialization of each of the sub-pixels 11R and 11W being achieved.

Subsequently, the driving section 20 carries out the Vth correction during a timing period of t3 to t4 (Vth correction period P2). More specifically, the power line driving section 26 changes the power signal DS from the voltage Vini to the voltage Vccp at the timing t3 ((C) of FIG. 9). This causes the driving transistor DRTr in each of the sub-pixels 11R and 11W to operate at a saturation region, and accordingly, a current Ids flows from the drain to the source of each driving transistor DRTr, resulting in an increase in the source voltage Vs ((F) and (H) of FIG. 9). On this occasion, in this example, the source voltage Vs is lower than the voltage Vcath on the cathode of the light-emitting device 19, and thus the light-emitting device 19 remains in an inversely-biased state, resulting in no current flowing through the light-emitting device 19. In such a manner, the gate-source voltage Vgs decreases with an increase in the source voltage Vs, leading to a decrease in the current Ids. This negative feedback operation causes the current Ids to converge toward "0 (zero)". In other words, the gate-source voltage Vgs of the driving transistor DRTr in each of the sub-pixels 11R and 11W converges to become equal to the threshold voltage Vth of the driving transistor DRTr (Vgs=Vth).

Thereafter, the scan line driving section 23 changes a voltage of each of the scan signals WSA and WSB from a high level to a low level at the timing t4 ((A) and (B) of FIG. 9). This turns off the writing transistor WSTr in each of the sub-pixels 11R and 11W. At the same time, the data line driving section 27 sets the signal Sig at the pixel voltage VsigR ((D) of FIG. 9).

Afterward, the driving section 20 writes the pixel voltage VsigR to the sub-pixel 11R, and performs the μ correction, during a timing period of t5 to t6 (writing and μ correction period P3). More specifically, the scan line driving section 23 changes a voltage of the scan signal WSA from a low level to a high level at the timing t5 ((A) of FIG. 9). This turns on the writing transistor WSTr in the sub-pixel 11R, and the gate voltage Vg of the driving transistor DRTr in the sub-pixel 11R rises from the voltage Vofs up to the pixel voltage Vsig ((E) of FIG. 9). On this occasion, the gate-source voltage Vgs of the driving transistor DRTr becomes greater than the threshold voltage Vth (Vgs>Vth), and the current Ids flows from the drain to the source, resulting in a rise in the source voltage Vs of the driving transistor DRTr ((F) of FIG. 9). Such a negative feedback operation suppresses an influence of device variations in the driving transistor DRTr (μ correction), and sets the gate-source voltage Vgs of the driving transistor DRTr at a voltage Vemi corresponding to the pixel voltage Vsig. It is to be noted that such a method of the μ correction is described in Japanese Unexamined Patent Application Publication No. 2006-215213, for example.

Next, the driving section 20 allows the sub-pixel 11R to emit light during a timing period subsequent to the timing t6 (light-emitting period P4). More specifically, the scan line driving section 23 changes a voltage of the scan signal WSA from a high level to a low level at the timing t6 ((A) of FIG. 9). This turns off the writing transistor WSTr in the sub-pixel 11R to put the gate of the driving transistor DRTr in the sub-pixel 11R in a floating state, resulting in a voltage between terminals of the capacitor Cs, that is, the gate-source voltage Vgs of the driving transistor DRTr being maintained from then on. Subsequently, as the current Ids flows through the driving transistor DRTr, the source voltage Vs of the driving transistor DRTr rises ((F) of FIG. 9), and accordingly, the gate voltage Vg of the driving transistor DRTr also rises ((E) of FIG. 9). Then, when the source voltage Vs of the driving transistor DRTr becomes greater than a sum of a threshold voltage Vel of the light-emitting device 19 and the voltage Vcath (Vel+Vcath), a current flows between the anode and the cathode of the light-emitting device 19, which leads to light emission from the light-emitting device 19. That is, the source voltage Vs rises to the extent corresponding to device variations in the light-emitting device 19, resulting in light emission from the light-emitting device 19.

Subsequently, the data line driving section 27 sets the signal Sig at the pixel voltage VsigW ((D) of FIG. 9).

Thereafter, the driving section 20 writes the pixel voltage VsigW to the sub-pixel 11W, and performs the μ correction during a timing period of t8 to t9 (writing and μ correction period P5). More specifically, the scan line driving section 23 changes a voltage of the scan signal WSB from a low level to a high level at the timing t8 ((B) of FIG. 9). As with the case of the writing and μ correction period P3, this leads to writing of the pixel voltage VsigW to the sub-pixel 11W and the μ correction.

Afterward, the driving section 20 allows the sub-pixel 11W to emit light during a timing period subsequent to the timing t9 (light-emitting period P6). More specifically, the scan line driving section 23 changes a voltage of the scan signal WSB from a high level to a low level at the timing t9 ((B) of FIG. 9). As with the case of the light-emitting period P4, this leads to light emission of the light-emitting device 19 in the sub-pixel 11W.

Subsequently, in the display unit 1, after a predetermined timing period (one frame period) elapses, a transition takes place from the light-emitting periods P4 and P6 to the initialization period P1. The driving section 20 drives the display section 10 to repeat such a sequence of operation.

(About Pitched Section PS)

In the display unit 1, the plurality of windows WIN are provided in the sub-pixels 11, and the pitched sections PS on the insulating layer 213 are also provided in a manner of surrounding each of the windows WIN. Hereinafter, detailed description is provided on a function of the pitched section PS.

Figure 10:
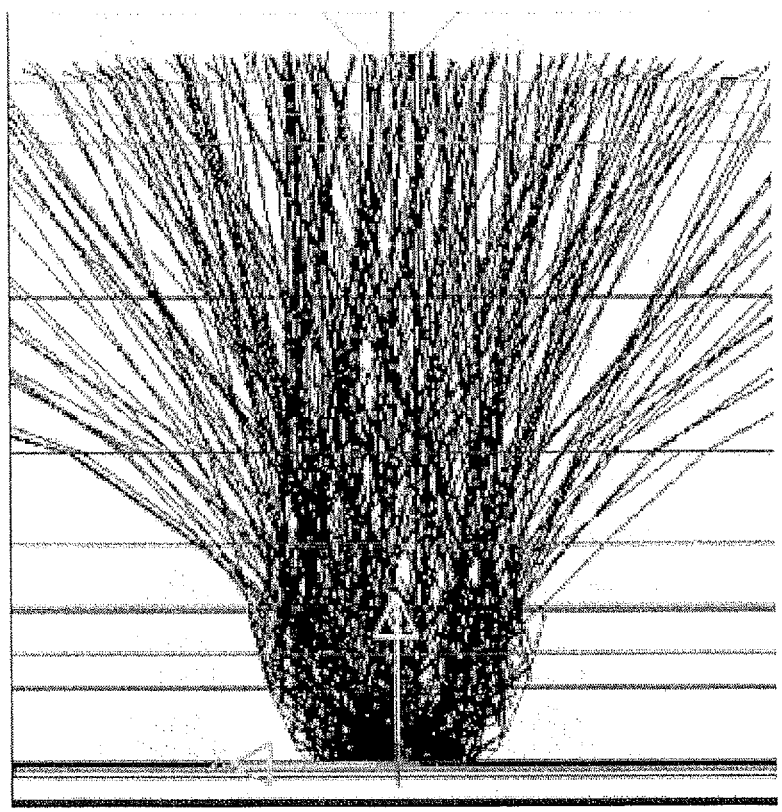
FIG. 10 is an explanatory diagram showing light beams in the window illustrated in FIG. 8.

FIG. 10 shows an example of a simulation result of light beams in the vicinity of the window WIN. FIG. 10 illustrates how the light emitted from a light-emitting layer 214 (downside) travels toward the display surface side (upside). As shown in FIG. 10, the light is emitted out in various directions from the light-emitting layer 214 at the window WIN. More specifically, the light emitted from the light-emitting layer 214 may travel in a direction of a normal to the light-emitting layer 214 (an upper direction in FIG. 10), or may travel in any direction that is deviated from the direction of the normal to the light-emitting layer 214, for example. A part of the light travelling in a direction that is deviated from the direction of the normal to the light-emitting layer 214 enters the pitched sections PS on the insulating layer 213, being reflected. That is, in the pitched section PS, as shown in FIG. 8, the insulating layer 213 and the insulating layer 216 that have the refractive indices different from each other are placed next to each other with the light-emitting layer 214 and the cathode 215 interposed between, and thus, such a difference in the refractive index causes the light to be reflected. Thereafter, the reflected light travels toward the display surface side to be extracted to the outside of the display section 10.

As described above, in the display section 10, the pitched sections PS are provided in a manner of surrounding the windows WIN, which makes it possible to improve the efficiency in extracting light to the outside. In other words, for example, if the pitched section PS is not provided, it is likely that the light emitted in a direction that is deviated from the direction of the normal to the light-emitting layer 214 will be weakened inside the display section, or may be blocked by the black matrix 219. In this case, a rate of the light to be extracted to the outside of the display section out of the whole light emitted from the light-emitting layer 214 decreases, resulting in a decrease in the light extraction efficiency. On the other hand, in the display section 10, the pitched sections PS are provided, and light is reflected on the pitched sections PS, which makes it possible to raise the light extraction efficiency.

To reflect light efficiently on the pitched section PS, each parameter may be preferably set in the following manner. More specifically, when the refractive index of the insulating layer 216 is n1, and the refractive index of the insulating layer 213 is n2, these refractive indices n1 and n2 may desirably satisfy the following Expressions.

$$1.1 \leq n1 \leq 1.8 \quad (1)$$

$$n1 - n2 \geq 0.20 \quad (2)$$

Further, the height H, as well as the diameters R1 and R2 (FIG. 8) may desirably satisfy the following Expressions.

$$0.5 \leq R1/R2 \leq 0.8 \quad (3)$$

$$0.5 \leq H/R1 \leq 2.0 \quad (4)$$

Each of these parameters including the refractive indices n1 and n2, the height H, and the diameters R1 and R2 may be desirably determined to satisfy the other specifications such as the luminance viewing angle in the range satisfying the above Expressions (1) to (4).

Additionally, in the display section 10, the plurality of such windows WIN are provided, and the pitched sections PS are provided in a manner of surrounding each of the windows WIN, which makes it possible to effectively use the pitched sections PS at the plurality of windows WIN, as well as to improve the efficiency in extracting light to the outside.

Furthermore, in the display section 10, the plurality of such windows WIN are provided, which allows the power consumption to be reduced. More specifically, in the display section 10, it is likely that the aperture ratio may decrease due to provision of the plurality of windows WIN as compared with a case where a single larger window is provided. However, even in such a case, it is possible to achieve the equivalent luminance in the sub-pixels 11 by improving the efficiency in extracting light to the outside as mentioned above. In concrete terms, for example, even if the aperture ratio is reduced by half due to provision of the plurality of windows WIN, it is possible to achieve the equivalent luminance in the sub-pixels 11 without changing the current density in the light-emitting layer 214 by increasing the light extraction efficiency by a factor of two. In such a manner, it is possible to reduce the power consumption by lowering the aperture ratio while maintaining the current density in the light-emitting layer 214. Further, for example, even if the aperture ratio is reduced by half, when the light extraction efficiency is made larger by a factor of two or more, it is possible to achieve the equivalent luminance in the sub-pixels 11 even though the current density in the light-emitting layer 214 is lowered. In this case, the power consumption is allowed to be further reduced. In addition, it is also possible to suppress the aging deterioration in the light emission characteristics (so-called burn-in). In other words, the organic EL layer that configures the light-emitting layer 214 may be typically easy to cause the aging deterioration with an increase in the current density, and thus, such lowering of the current density reduces a possibility of the aging deterioration, which makes it possible to improve the image quality.

Moreover, in the display section 10, provision of the plurality of windows WIN allows the display section 10 to be manufactured more easily. More specifically, provision of the plurality of windows WIN makes it possible to reduce the diameter R1 of each of the windows WIN, and thus, the height H (thickness) of the insulating layer 213 is allowed to be made smaller as represented in Expression (4). Since this insulating layer 213 may be formed using, for example, a photoresist material, such as acrylic, polyimide, and novolac, by photolithography, it is possible to form the insulating layer 213 with a smaller thickness in a smaller amount of time. In such a manner, the plurality of windows WIN are provided in the display section 10, and thus it is possible to form the insulating layer 213 in a smaller amount of time, which leads to easy manufacturing.

Advantageous Effects

As described thus far, in this embodiment of the present disclosure, the plurality of windows are provided, and the pitched sections PS are provided in a manner of surrounding each of the windows, which makes it possible to improve the efficiency in extracting light to the outside, as well as to reduce the power consumption.

In this embodiment of the present disclosure, the plurality of windows are provided, and thus it is possible to reduce the insulating layer in thickness, which allows the display section to be manufactured more easily.

Modification Example 1-1

Figure 11:
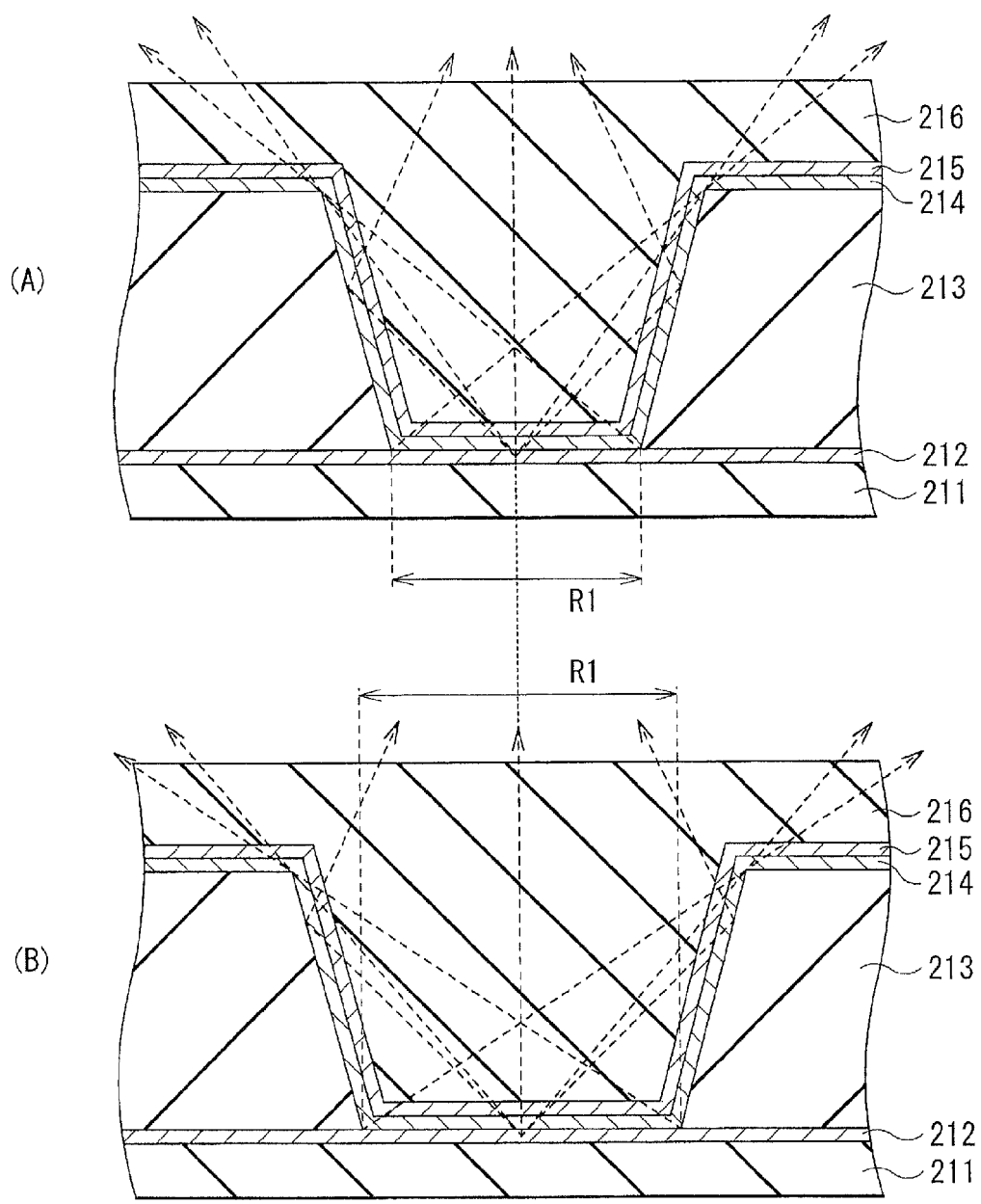
FIG. 11 is another explanatory diagram showing light beams in the window illustrated in FIG. 8.

In the above-described embodiment of the present disclosure, the window WIN is formed in the circular shape. However, the shape is not limited thereto, and it may be, for example, an ellipse alternatively. This makes it possible to enhance a degree of freedom in the arrangement of the windows WIN. Examples where the window WIN in the elliptical shape would be effective may include a case where there is left a space when the windows WIN in the circular shapes are arranged, but it is possible to eliminate a wasted space in such a manner that each of the windows WIN is formed in the elliptical shape by stretching the circular shape in one direction. In this case, the area of each of the windows WIN is allowed to be made larger, which makes it possible to raise the aperture ratio, as well as to form the light-emitting layer 214 and the cathode 215 at the window WIN more uniformly in the manufacturing process. Further, formation of the window WIN in the elliptical shape allows a viewing angle to be widened in a specific direction. That is, as shown in FIG. 11, because light spreads in a direction that is more greatly deviated from the direction of the normal to the major axis direction ((B) of FIG. 11) as compared with the minor axis direction ((A) of FIG. 11), it is possible to widen the viewing angle in the direction (major axis direction) depending on the oriented direction of the window WIN. Alternatively, both of the window WIN in the vertically long elliptical shape and the window WIN in the horizontally long elliptical shape may be provided. In this case, it is possible to widen the viewing angles both in the vertical direction and in the horizontal direction.

Modification Example 1-2

Figure 12A:
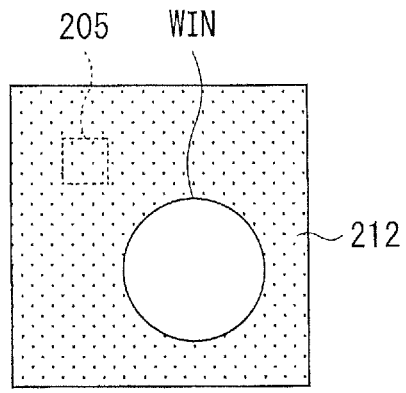
FIG. 12A is a plan view showing an example of an arrangement of a window according to a modification example of the first embodiment of the present disclosure.
Figure 12B:
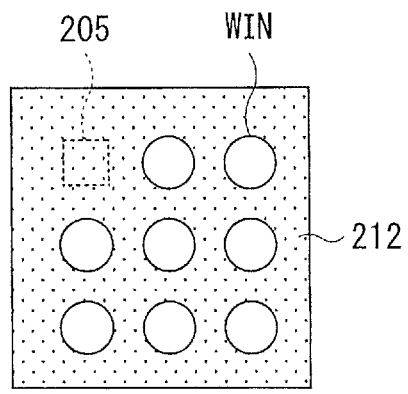
FIG. 12B is a plan view showing an example of an arrangement of windows according to another modification example of the first embodiment of the present disclosure.
Figure 12C:
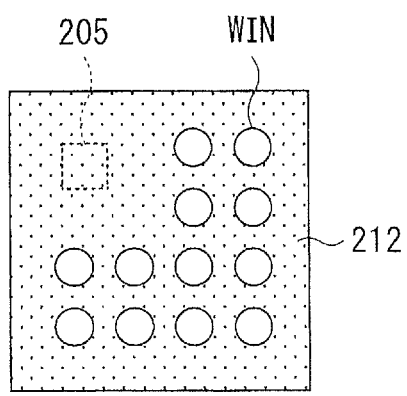
FIG. 12C is a plan view showing an example of an arrangement of windows according to still another modification example of the first embodiment of the present disclosure.
Figure 13A:
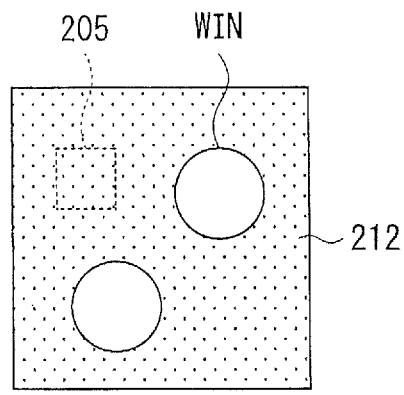
FIG. 13A is a plan view showing an example of an arrangement of windows according to still another modification example of the first embodiment of the present disclosure.
Figure 13B:
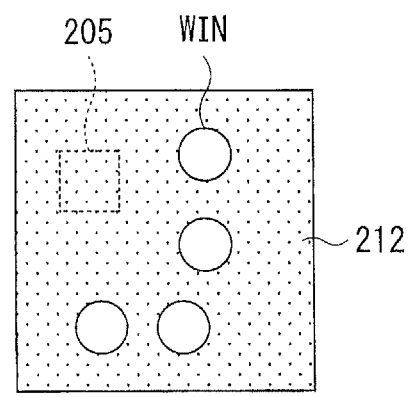
FIG. 13B is a plan view showing an example of an arrangement of windows according to still another modification example of the first embodiment of the present disclosure.
Figure 13C:
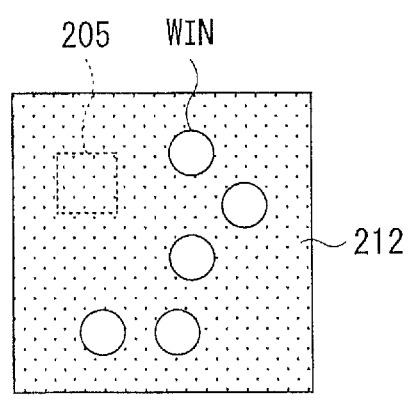
FIG. 13C is a plan view showing an example of an arrangement of windows according to still another modification example of the first embodiment of the present disclosure.
Figure 13D:
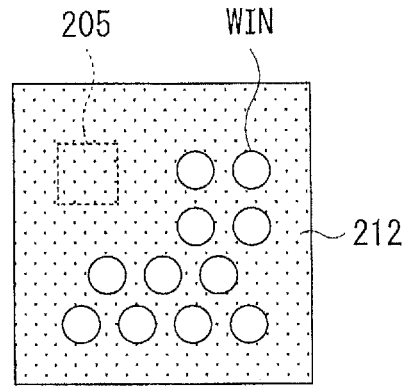
FIG. 13D is a plan view showing an example of an arrangement of windows according to still another modification example of the first embodiment of the present disclosure.
Figure 13E:
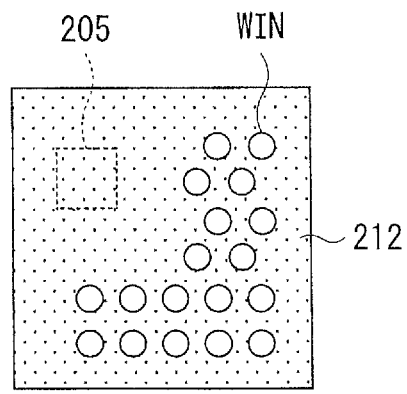
FIG. 13E is a plan view showing an example of an arrangement of windows according to still another modification example of the first embodiment of the present disclosure.
Figure 13F:
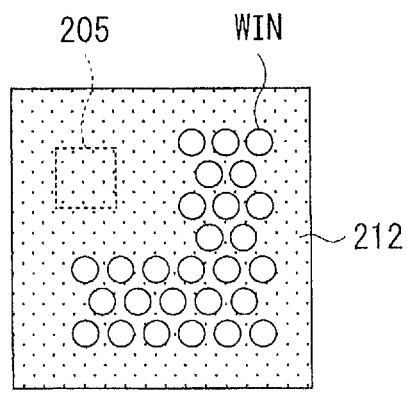
FIG. 13F is a plan view showing an example of an arrangement of windows according to still another modification example of the first embodiment of the present disclosure.

In the above-described embodiment of the present disclosure, three windows WIN are provided in a region of each of the anodes 212. However, the configuration is not limited thereto, and the arbitrary number of windows WIN may be provided in consideration of the aperture ratio, the thickness (height H) of the insulating layer 213, and the like as shown in FIGS. 12A to 12C. In concrete terms, for example, only one window WIN (FIG. 12A), eight windows WIN (FIG. 12B), or twelve windows WIN (FIG. 12C) may be provided. Further, as shown in FIGS. 13A to 13F, even if a size of the contact 205 is different from the size of the contact 205 in the above-described embodiment of the present disclosure, it is possible to arrange the arbitrary number of windows WIN in a manner of satisfying a design rule concerning a distance from the contact 205 to each of the windows WIN.

Modification Example 1-3

Figure 14A:
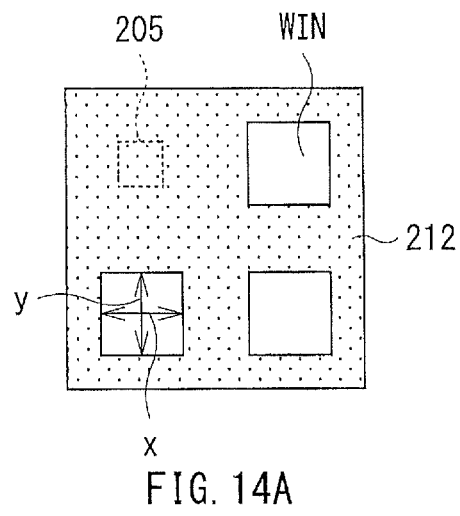
FIG. 14A is a plan view showing an example of an arrangement of windows according to still another modification example of the first embodiment of the present disclosure.
Figure 14B:
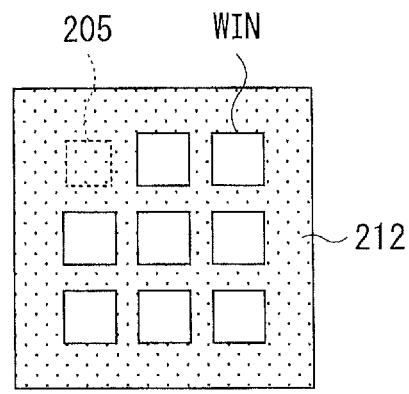
FIG. 14B is a plan view showing an example of an arrangement of windows according to still another modification example of the first embodiment of the present disclosure.
Figure 14C:
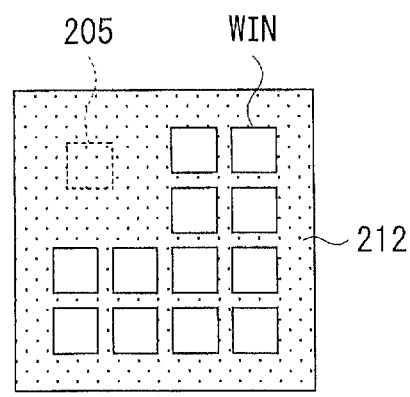
FIG. 14C is a plan view showing an example of an arrangement of windows according to still another modification example of the first embodiment of the present disclosure.

In the above-described embodiment of the present disclosure, the window WIN is formed in the circular shape. However, the shape is not limited thereto, and it may be, for example, a quadrilateral such as a square and a rectangle alternatively as shown in FIG. 14A and FIG. 14B. It is to be noted that four corners of the quadrilateral may be rounded, for example. In this case, in Expressions (3) and (4), spacing intervals between facing sides (x and y in FIG. 14A) may be used instead of the diameters. More specifically, it may be desirable that a spacing interval x1 on the anode electrode 212 side and a spacing interval x2 on the display surface side satisfy the following Expressions (5) and (6), and a spacing interval y1 on the anode electrode 212 side and a spacing interval y2 on the display surface side satisfy the following Expressions (7) and (8).

$$0.5 \leq x1/x2 \leq 0.8 \quad (5)$$

$$0.5 \leq H/x1 \leq 2.0 \quad (6)$$

$$0.5 \leq y1/y2 \leq 0.8 \quad (7)$$

$$0.5 \leq H/y1 \leq 2.0 \quad (8)$$

Modification Example 1-4

Figure 15:
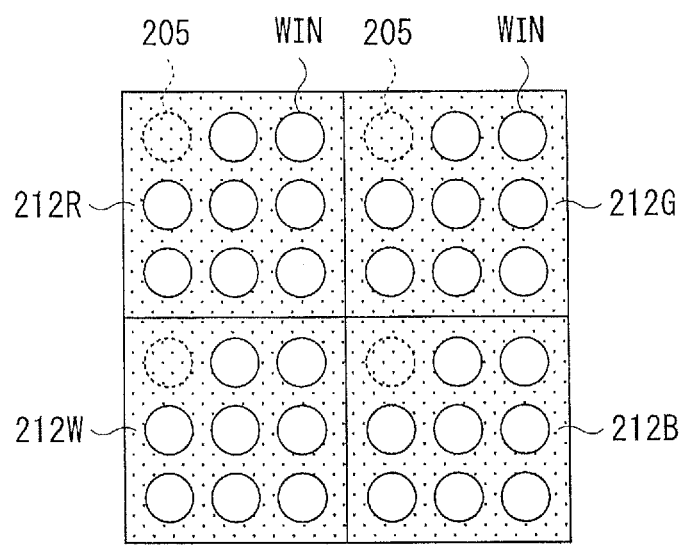
FIG. 15 is a plan view showing an example of an arrangement of windows according to still another modification example of the first embodiment of the present disclosure.
Figure 16:
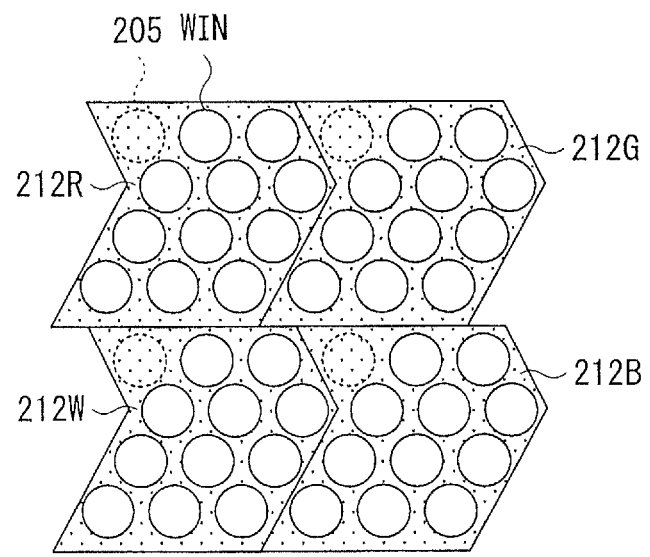
FIG. 16 is a plan view showing an example of an arrangement of windows according to still another modification example of the first embodiment of the present disclosure.

In the above-described embodiment of the present disclosure, the contact 205 is formed in the square shape. However, the shape is not limited thereto, and the contact 205 may be formed in the circular shape, and may have the size substantially equivalent to that of the window WIN as shown FIG. 15. In this case, it is possible to arrange the contacts 205 and the windows WIN in the limited area more efficiently. Further, as shown in FIG. 16, the contacts 205 and the windows WIN may be arranged in a close-packed arrangement. In this close-packed arrangement, for example, three windows WIN may be arranged to be adjacent to one another. This allows the contacts 205 and the windows WIN to be arranged further more efficiently. In this case, each side that configures a contour of the anode 212 is provided at a gap between the contact 205 and the window WIN. As a result, in this example, a top side and a bottom side of the anode 212 extend in a horizontal direction, but each of two left sides and two right sides form the alphabetical "V" shape, and each of the sides extends in a direction that is deviated by about 60 degrees from the horizontal direction.

Modification Example 1-5

Figure 17:
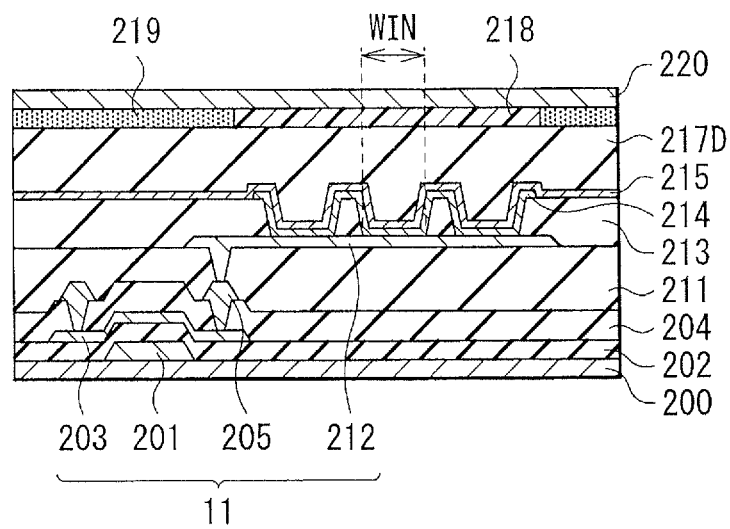
FIG. 17 is a cross-sectional view showing a simplified cross-sectional structure of a display section according to another modification example of the first embodiment of the present disclosure.

In the above-described embodiment of the present disclosure, as shown in FIG. 4, the insulating layer 216 is formed on the cathode 215. However, the configuration is not limited thereto. This insulating layer 216 has a function to prevent variation in the characteristics such as the light emission efficiency that may be caused by intrusion of moisture into the light-emitting layer 214. However, the insulating layer 216 may be omitted as shown in FIG. 17 in a case where various issues resulting from such moisture intrusion may be resolved by any other technology. In this example, the cathode 215 is attached to the substrate 220 on which the color filter 218 and the black matrix 219 are formed on the surface with the insulating layer 217D that is made of resin for sealing in between. As with the refractive indices of the insulating layers 213 and 216 in the above-described embodiment of the present disclosure, refractive indices of the insulating layers 213 and 217D are set in such a manner that the light incoming from the insulating layer 217D side is reflected on the pitched sections PS of the insulating layer 213 that surrounds the windows WIN. In concrete terms, when the refractive index of the insulating layer 217D is n1, and the refractive index of the insulating layer 213 is n2, Expressions (1) and (2) may be desirably satisfied.

Modification Example 1-6

Figure 18:
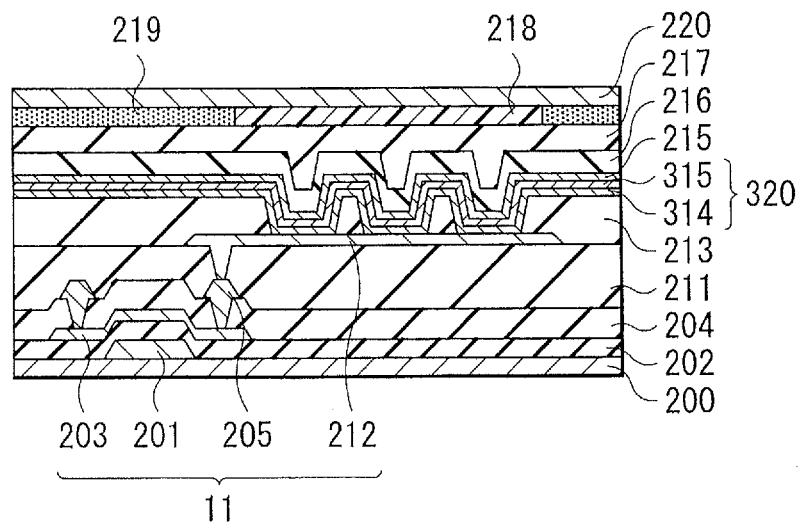
FIG. 18 is a cross-sectional view showing a simplified cross-sectional structure of a display section according to still another modification example of the first embodiment of the present disclosure.
Figure 19:
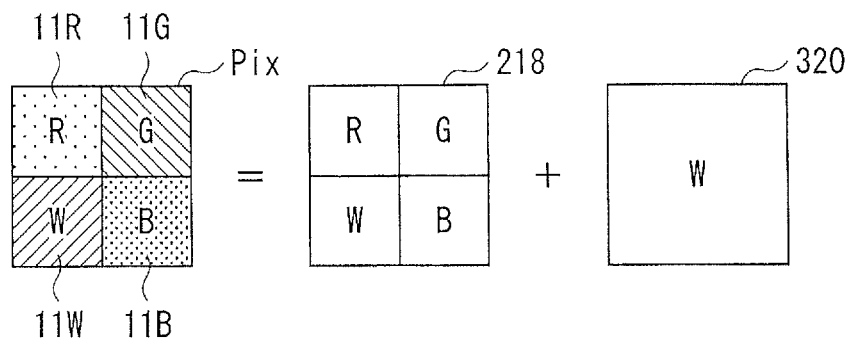
FIG. 19 is an explanatory diagram showing a configuration of the sub-pixels in the display section illustrated in FIG. 18.

In the above-described embodiment of the present disclosure, as shown in FIG. 4 and FIG. 5, the light-emitting layer 214 that emits light of red, green, blue, and white is provided. However, the configuration is not limited thereto, and a light-emitting layer 320 that emits white light may be provided alternatively as shown in FIG. 18 and FIG. 19. The light-emitting layer 320 is configured of a yellow light-emitting layer 314 and a blue light-emitting layer 315. In this example, the yellow light-emitting layer 314 is arranged on the anode 212 side, and the blue light-emitting layer 315 is arranged on the cathode 215 side. The yellow light-emitting layer 314 is an organic EL layer that emits yellow light, and the blue light-emitting layer 315 is an organic EL layer that emits blue light. The yellow light emitted from the yellow light-emitting layer 314 and the blue light emitted from the blue light-emitting layer 315 are mixed to turn into the white light. Subsequently, as shown in FIG. 19, in the sub-pixels 11R, 11G, and 11B, a red component, a green component, and a blue component are separated from this white light to be output by the color filter 218 of red (R), green (G), and blue (B), respectively. Further, in the sub-pixel 11W, a color gamut of the white light is adjusted by the color filter 218 of white (W). It is to be noted that, in this example, on the light-emitting layer 320, the yellow light-emitting layer 314 is arranged on the anode 212 side, and the blue light-emitting layer 315 is arranged on the cathode 215 side. However, the arrangement is not limited thereto, and as an alternative, for example, the yellow light-emitting layer 314 may be arranged on the cathode 215 side, and the blue light-emitting layer 315 may be arranged on the anode 212 side.

2. Second Embodiment

Next, description is provided on a display unit 2 according to a second embodiment of the present disclosure. The second embodiment is different from the above-described first embodiment in the shape and arrangement of the anode electrode. Any other configurations are similar to those in the above-described first embodiment of the present disclosure (FIG. 1). It is to be noted that any component parts substantially the same as those in the display unit 1 according to the above-described first embodiment are denoted with the same reference numerals, and the related descriptions are omitted as appropriate.

As shown in FIG. 1, the display unit 2 includes a display section 30. As described hereinafter, a pixel Pix in the display section 30 is configured of four sub-pixels 12 of red, green, blue, and white.

Figure 20:
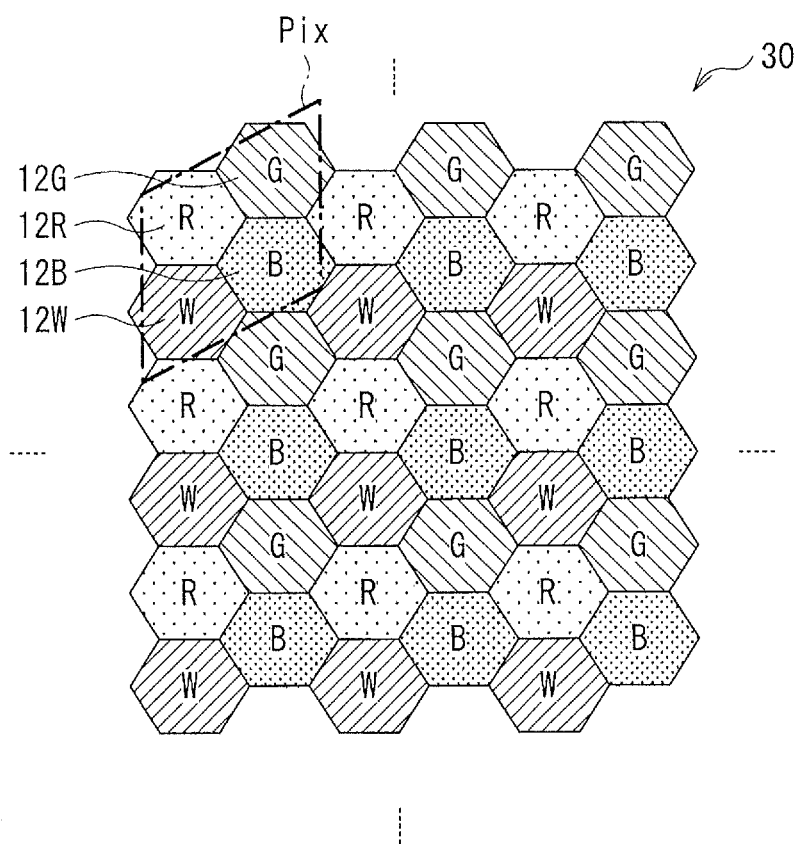
FIG. 20 is a schematic diagram showing an arrangement of sub-pixels in a display section according to a second embodiment of the present disclosure.

FIG. 20 shows an example of an arrangement of the sub-pixels 12 in the display section 30. Each of the pixels Pix has four sub-pixels 12R, 12G, 12B, and 12W of red (R), green (G), blue (B), and white (W), respectively. Each of the sub-pixels 12 has a hexagonal shape. In this example, in the pixel Pix, the sub-pixel 12R and the sub-pixel 12W are arranged side-by-side in a vertical direction (longitudinal direction), and the sub-pixel 12G and the sub-pixel 12B are arranged side-by-side in the vertical direction. Further, in the vertical direction, the sub-pixels 12R and 12W are arranged to be shifted from the sub-pixels 12G and 12B by a half of the sub-pixel 12 in size. More specifically, in the pixel Pix, the sub-pixel 12G is arranged at the upper right of the sub-pixel 12R, and the sub-pixel 12B is arranged at the upper right of the sub-pixel 12W. In other words, in the display section 30, three sub-pixels 12 are arranged to be adjacent to one another.

Figure 21:
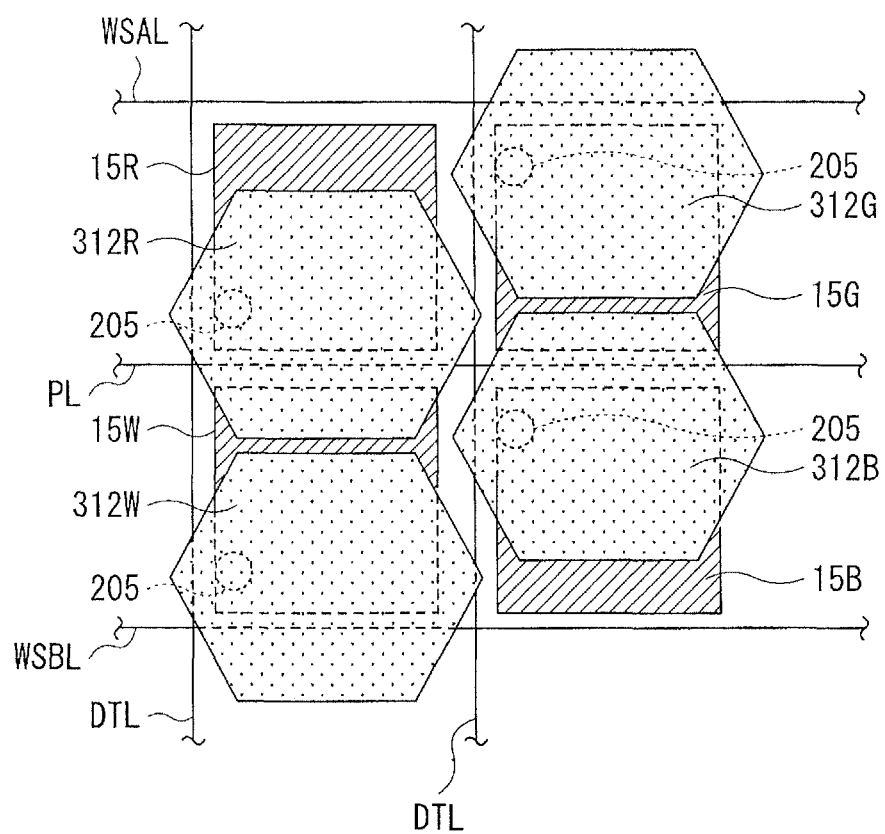
FIG. 21 is a plan view showing an example of an arrangement of anodes in the display section illustrated in FIG. 20.

FIG. 21 shows an arrangement of anodes in the pixel Pix. The pixel Pix is provided with four anodes 312R, 312G, 312B, and 312W. The anodes 312R, 312G, 312B, and 312W are anodes for the sub-pixels 12R, 12G, 12B, and 12W, respectively. As with the sub-pixels 12R, 12G, 12B, and 12W that are illustrated in FIG. 20, each of these anodes 312R, 312G, 312B, and 312W has the hexagonal shape, and the anodes 312G and 312B are arranged to be shifted from the anodes 312R and 312W in the vertical direction (longitudinal direction). In other words, for example, three anodes 312 are arranged to be adjacent to one another. It is to be noted that, for example, six corners of the hexagonal shape may be rounded. On the other hand, circuit regions 15G and 15B are arranged at the same positions as circuit regions 15R and 15W in the vertical direction. Each of the anodes 312R, 312G, 312B, and 312W is connected via a contact 205 with a source of a driving transistor DRTr that is formed at each of the circuit regions 15R, 15G, 15B, and 15W, respectively.

Figure 22:
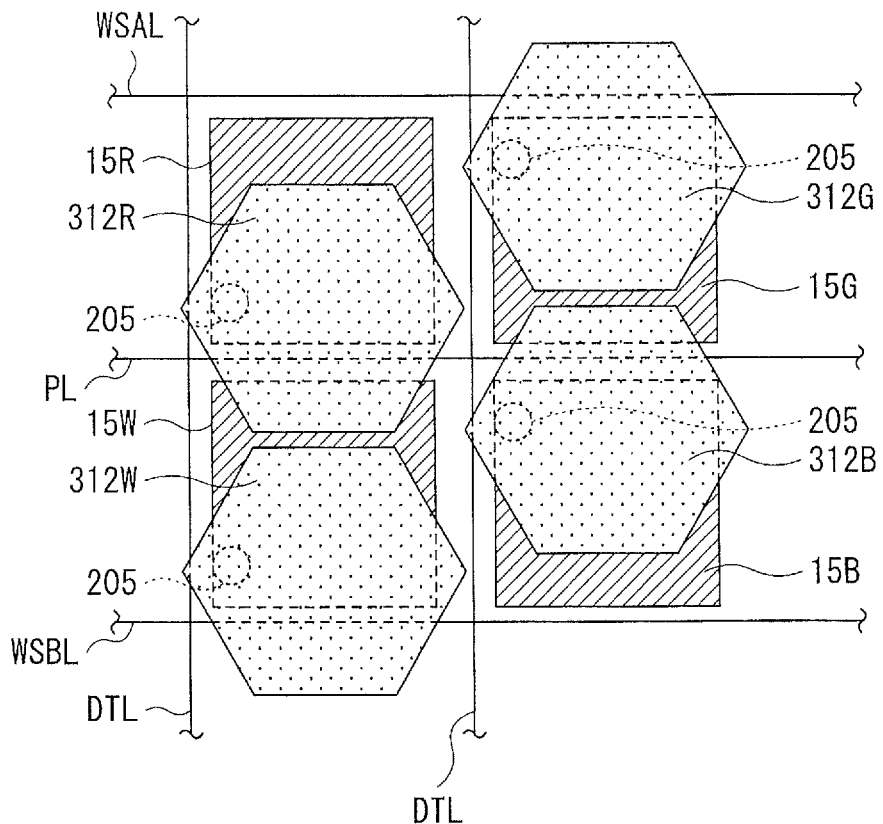
FIG. 22 is a plan view showing another example of an arrangement of the anodes in the display section illustrated in FIG. 20.

In this example, each of these anodes 312 has the hexagonal shape that extends in a horizontal direction (transverse direction) instead of a regular hexagon. This makes it possible to further enlarge a size of the anodes 312. More specifically, if the anode 312 is formed in the regular hexagon, a spacing interval between the anodes 312 would be widened in the horizontal direction (transverse direction) as shown in FIG. 22. To utilize this space effectively, the anode 312 may be desirably formed in the hexagonal shape that extends in the horizontal direction as shown in FIG. 21. On this occasion, the anode 312 may desirably take the shape that is formed by enlarging the regular hexagon in the horizontal direction as it is. In this case, an angle to be formed between each of an upper left side, a lower left side, an upper right side, and a lower right side of the hexagon and the horizontal direction becomes 60 degrees or less. Further, for example, by extending a top side and a bottom side, the regular hexagon may be extended in the horizontal direction while maintaining the angle to be formed between each of the upper left side, the lower left side, the upper right side, and the lower right side of the hexagon and the horizontal direction at 60 degrees. It is to be noted that, when there is no necessity for widening the anode 312, a configuration as shown in FIG. 2 may be adopted.

Figure 23:
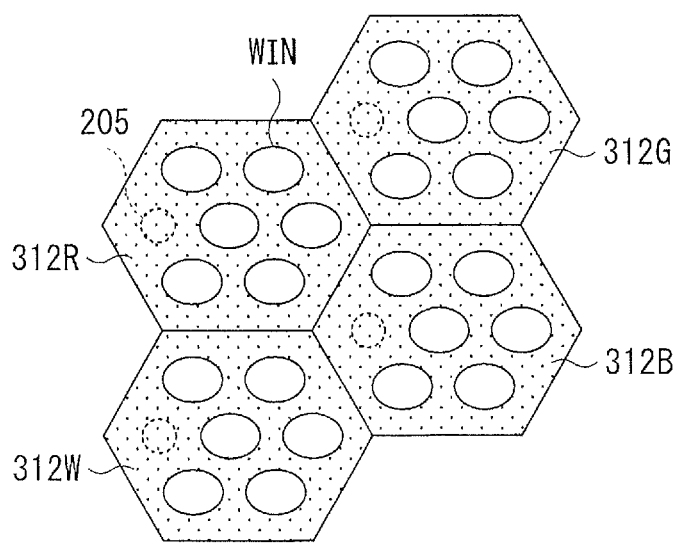
FIG. 23 is a plan view showing an example of an arrangement of windows in the display section illustrated in FIG. 20.

FIG. 23 schematically shows an arrangement of the windows WIN in each of the anodes 312. Each of the anodes 312R, 312G, 312B, and 312W is formed away from one another as shown in FIG. 21. However, FIG. 23 illustrates theses anodes as if they are placed adjacent to one another for the sake of explanatory convenience. In this example, six windows WIN are arranged on each of the anodes 312R, 312G, 312B, and 312W. The window WIN has the elliptical shape in this example. In this example, five windows WIN are arranged in the close-packed arrangement in each of the anodes 312R, 312G, 312B, and 312W. In other words, for example, three windows WIN may be arranged to adjoin to one another. As with the above-described embodiment of the present disclosure, at a surrounding area of the windows WIN, there are provided pitched sections PS on an insulating layer 213.

As described above, in the display section 30, the anode 312 is formed in the hexagonal shape, and the windows WIN in the elliptical shapes are arranged in the close-packed arrangement. In other words, the anode 312 is formed in the shape corresponding to an arrangement of the windows WIN. This makes it possible to arrange the plurality of windows WIN efficiently in a region of the anode 312. On this occasion, when the anode 312 is configured in the shape that is formed by enlarging the regular hexagon in the horizontal direction as it is, it is possible to achieve the close-packed arrangement with ease by changing the shape of the window WIN from the circular shape to the elliptical shape that is enlarged at the same ratio as the enlargement ratio of the anode 312.

Further, in the display section 30, each of the anodes 312 is formed in the hexagonal shape that extends in the horizontal direction, and an arrangement is made in such a manner that the anodes 312G and 312B are shifted from the anodes 312R and 312W in the vertical direction. This allows the anodes 312 to be arranged efficiently in the display section 30.

As described thus far, in this embodiment of the present disclosure, each anode is formed in the hexagonal shape, and the window having the elliptical shape is arranged in the close-packed arrangement. This makes it possible to arrange the anodes efficiently, as well as to arrange the plurality of windows efficiently in a region of the anode. Any other effect is similar to that in the above-described first embodiment of the present disclosure.

Modification Example 2-1

Figure 24A:
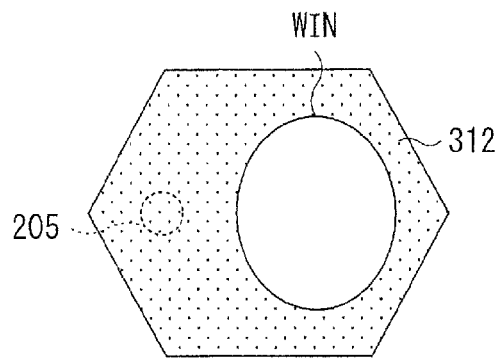
FIG. 24A is a plan view showing an example of an arrangement of a window according to a modification example of the second embodiment of the present disclosure.
Figure 24B:
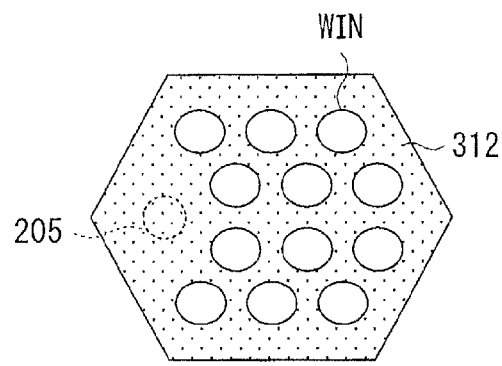
FIG. 24B is a plan view showing an example of an arrangement of windows according to another modification example of the second embodiment of the present disclosure.
Figure 24C:
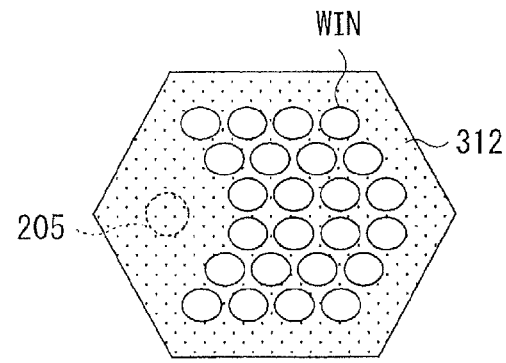
FIG. 24C is a plan view showing an example of an arrangement of windows according to still another modification example of the second embodiment of the present disclosure.
Figure 24D:
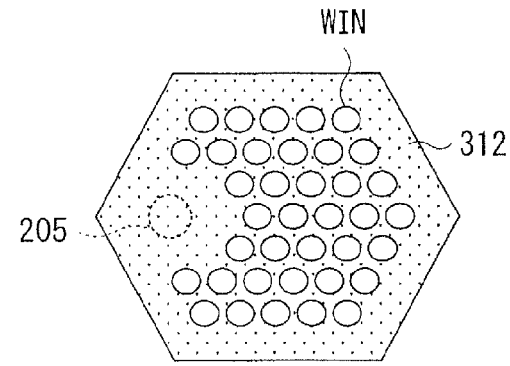
FIG. 24D is a plan view showing an example of an arrangement of windows according to still another modification example of the second embodiment of the present disclosure.
Figure 25A:
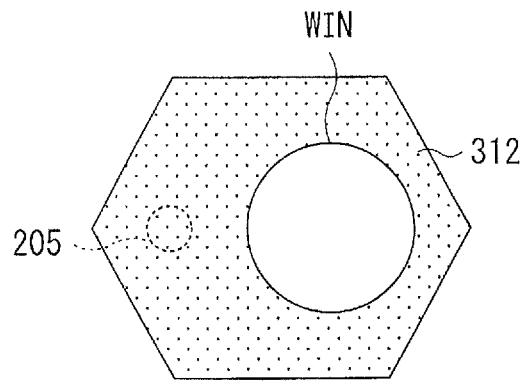
FIG. 25A is a plan view showing an example of an arrangement of a window according to still another modification example of the second embodiment of the present disclosure.
Figure 25B:
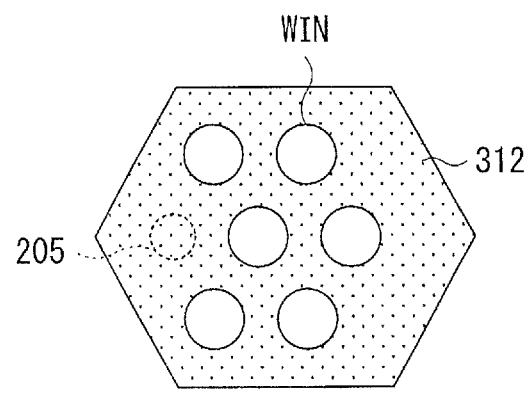
FIG. 25B is a plan view showing an example of an arrangement of windows according to still another modification example of the second embodiment of the present disclosure.
Figure 25C:
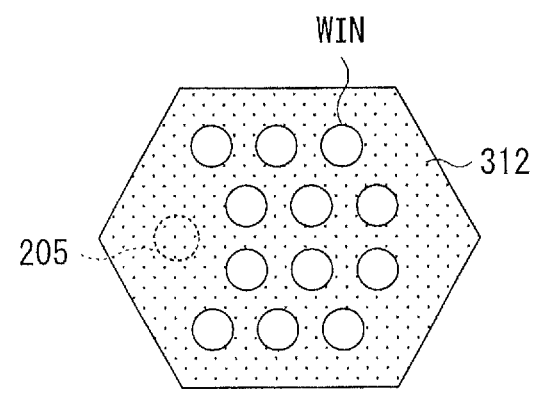
FIG. 25C is a plan view showing an example of an arrangement of windows according to still another modification example of the second embodiment of the present disclosure.
Figure 25D:
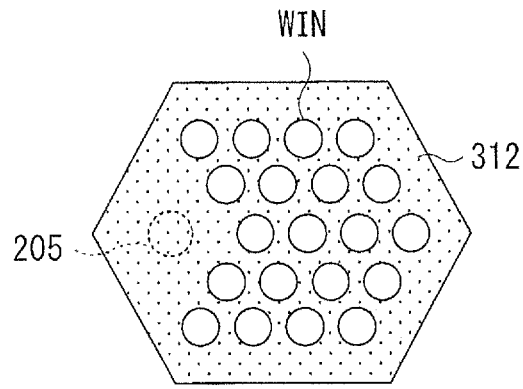
FIG. 25D is a plan view showing an example of an arrangement of windows according to still another modification example of the second embodiment of the present disclosure.
Figure 25E:
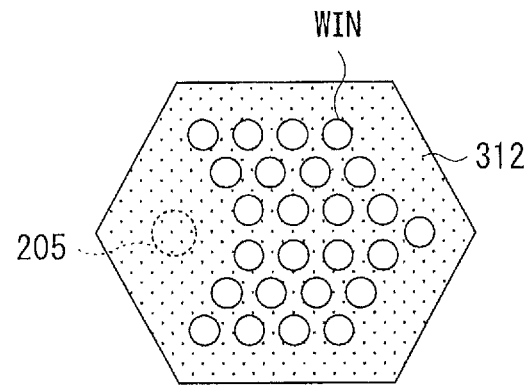
FIG. 25E is a plan view showing an example of an arrangement of windows according to still another modification example of the second embodiment of the present disclosure.
Figure 25F:
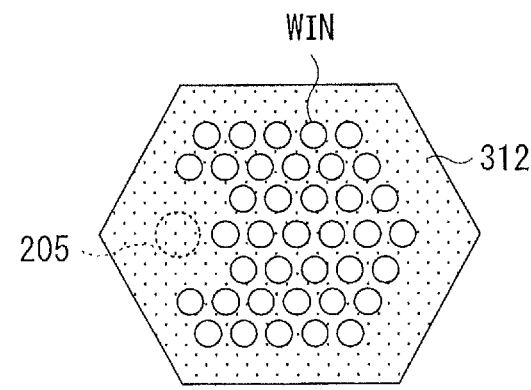
FIG. 25F is a plan view showing an example of an arrangement of windows according to still another modification example of the second embodiment of the present disclosure.

In the above-described embodiment of the present disclosure, six windows WIN are provided in a region of each of the anodes 312. However, an arrangement is not limited thereto, and not-more-than-five or not-less-than-seven windows WIN may be provided alternatively as shown in FIGS. 24A to 24D. For example, in FIG. 24D, the windows WIN are provided in seven rows. In such a manner, when the windows WIN are provided in odd-numbered rows, it is possible to arrange all the windows WIN in the close-packed arrangement. It is to be noted that even when the windows WIN are provided in even-numbered rows as shown in FIGS. 24B and 24C, it is possible to arrange the upper half of the windows WIN in the close-packed arrangement, as well as to arrange the lower half of the windows WIN in the close-packed arrangement.

Modification Example 2-2

Figure 26A:
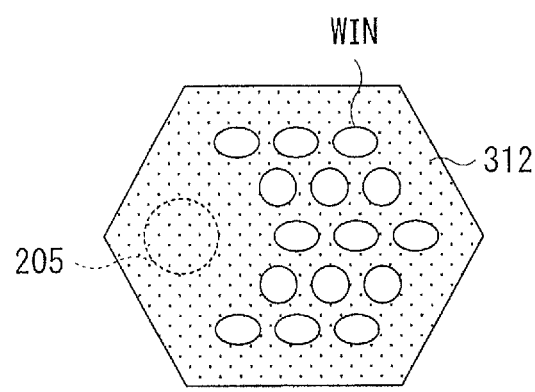
FIG. 26A is a plan view showing an example of an arrangement of windows according to still another modification example of the second embodiment of the present disclosure.
Figure 26B:
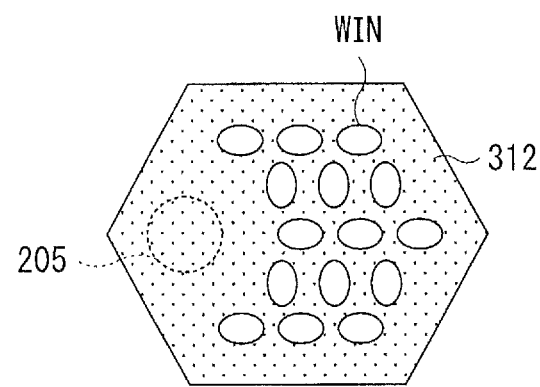
FIG. 26B is a plan view showing an example of an arrangement of windows according to still another modification example of the second embodiment of the present disclosure.

In the above-described embodiment of the present disclosure, the window WIN is formed in the elliptical shape. However, the shape is not limited thereto, and for example, the window WIN may take the circular shape as shown in FIGS. 25A to 25F. Alternatively, as shown in FIG. 26A, both of the window WIN in the elliptical shape and the window WIN in the circular shape may be provided. Further, as shown in FIG. 26B, both of the window WIN in the vertically-long elliptical shape and the window WIN in the horizontally-long elliptical shape may be provided. In this case, it is possible to widen a viewing angle in the horizontal direction as well as a viewing angle in the vertical direction.

3. Third Embodiment

Next, description is provided on a display unit 3 according to a third embodiment of the present disclosure. In this embodiment, the pixel Pix is configured of three sub-pixels of red, green, and blue. It is to be noted that any component parts substantially the same as those in the display unit 1 according to the above-described first embodiment are denoted with the same reference numerals, and the related descriptions are omitted as appropriate.

As shown in FIG. 1, the display unit 3 includes a display section 40 and a driving section 50. As described hereinafter, the pixel Pix in the display section 40 is configured of three sub-pixels 13 of red, green, and blue. The driving section 50 has an image signal processing section 51, a scan line driving section 53, a power line driving section 56, and a data line driving section 57.

Figure 27:
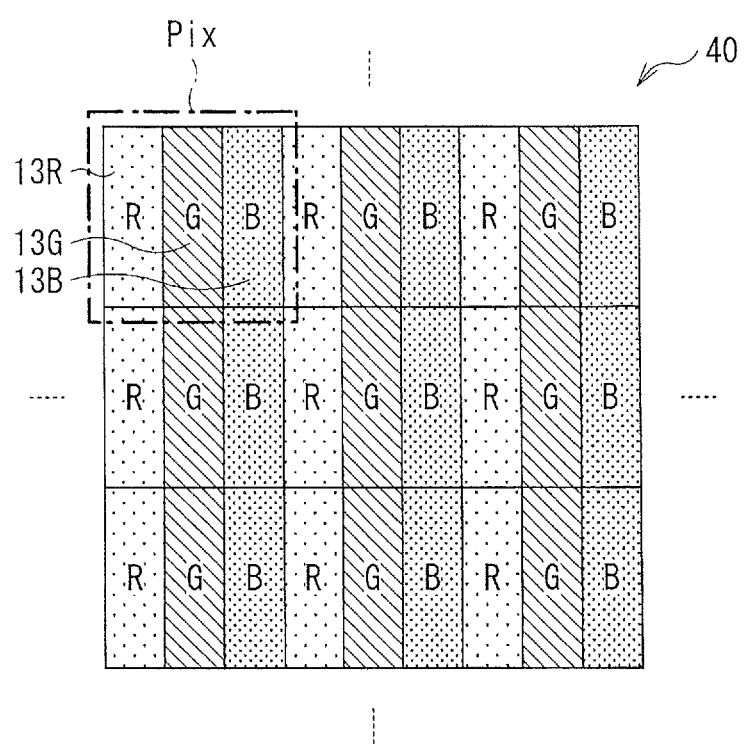
FIG. 27 is a schematic diagram showing an arrangement of sub-pixels in a display section according to a third embodiment of the present disclosure.

FIG. 27 shows an example of an arrangement of the sub-pixels 13 in the display section 40. Each of the pixels Pix has three sub-pixels 13R, 13G, and 13B of red (R), green (G), and blue (B), respectively. Each of the sub-pixels 13 extends in the vertical direction, and is provided side by side in the horizontal direction in the above-described order in the pixel Pix.

Figure 28:
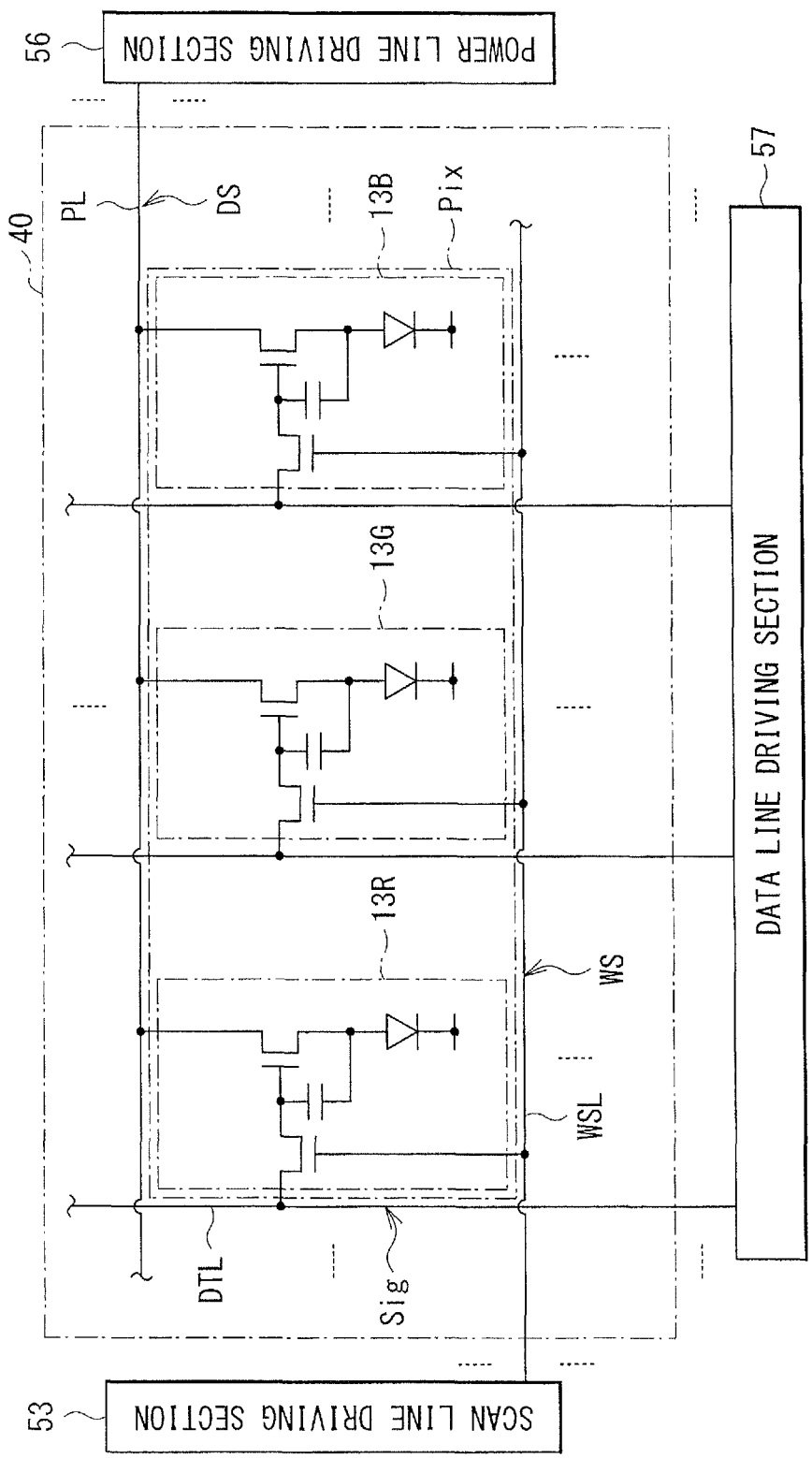
FIG. 28 is a circuit diagram showing an example of a configuration of the display section illustrated in FIG. 27.

FIG. 28 shows an example of a circuit configuration of the display section 40. The display section 40 has a plurality of scan lines WSL that extend in a row direction. The scan line WSL corresponds to the scan lines WSAL and WSBL in the above-described first embodiment. One end of the scan line WSL is connected with the scan line driving section 53. The sub-pixels 13R, 13G, and 13B that belong to one pixel Pix are connected with the same scan line WSL and the same power line PL. Further, the sub-pixels 13R, 13G, and 13B that belong to one pixel Pix are connected with the signal lines DTL that are different from one another.

The image signal processing section 51 performs a predetermined processing operation, such as gamma conversion, on an image signal Sdisp that is provided from the outside to generate an image signal Sdisp2. The scan line driving section 53 applies scan signals WS sequentially to the plurality of scan lines WSL in accordance with a control signal that is provided from a timing generating section 22, thereby selecting the sub-pixels 13 sequentially. The power line driving section 56 applies power signals DS sequentially to the plurality of power lines PL in accordance with the control signal that is provided from the timing generating section 22 to control light emission operation and light extinction operation of the sub-pixels 13. The data line driving section 57 generates a signal Sig including a pixel voltage Vsig instructing the light-emitting luminance of each of the sub-pixels 13 and a voltage Vofs for performing Vth correction to be hereinafter described, in accordance with the image signal Sdisp2 that is provided from the image signal processing section 51 and the control signal that is provided from the timing generating section 22 to apply such a generated signal to each of the data lines DTL.

Figure 29:
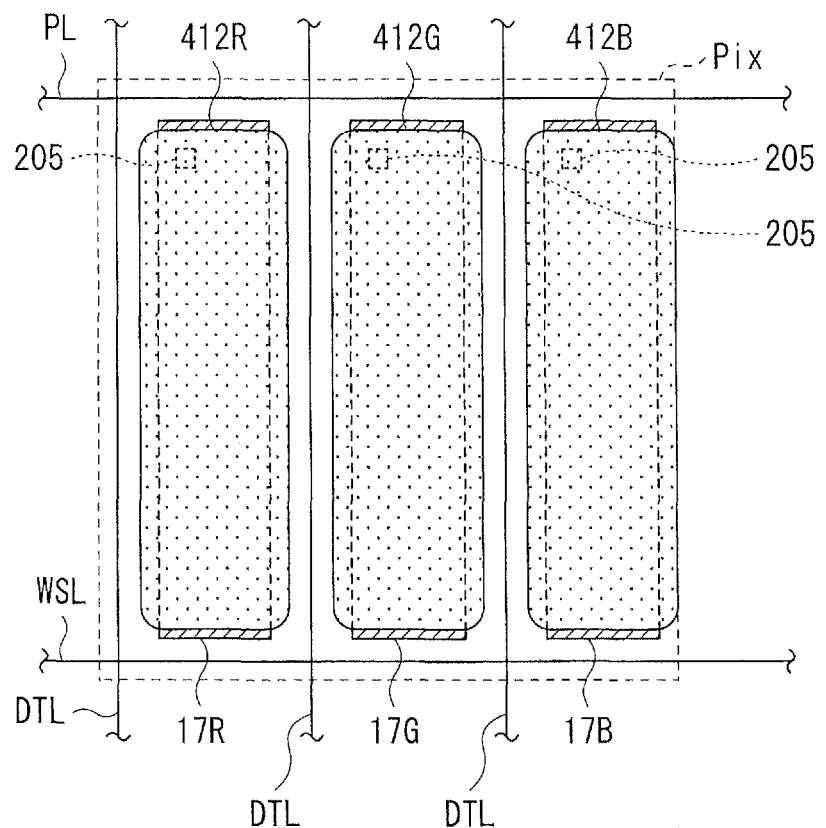
FIG. 29 is a plan view showing an example of an arrangement of anodes in the display section illustrated in FIG. 27.

FIG. 29 shows an arrangement of anodes in the pixel Pix. The pixel Pix is provided with three anodes 412R, 412G, and 412B, as well as circuit regions 17R, 17G, and 17B. The anodes 412R, 412G, and 412B are anodes in the sub-pixels 13R, 13G, and 13B, respectively. As with the sub-pixels 13R, 13G, and 13B that are illustrated in FIG. 27, these anodes 412R, 412G, and 412B extend in the vertical direction, and are provided side by side in this order in the horizontal direction. The circuit region 17R is a region where the devices other than the light-emitting device 19 in the sub-pixel 13R are arranged, the circuit region 17G is a region where the devices other than the light-emitting device 19 in the sub-pixel 13G are arranged, and the circuit region 17B is a region where the devices other than the light-emitting device 19 in the sub-pixel 13B are arranged. As with the anodes 412R, 412G, and 412B, these circuit regions 17R, 17G, and 17B extend in the vertical direction, and are provided side by side in this order in the horizontal direction. Each of the anodes 412R, 412G, and 412B is connected with a source of the driving transistor DRTr that is formed in each of the circuit regions 17R, 17G, and 17B via a contact 205.

Figure 30:
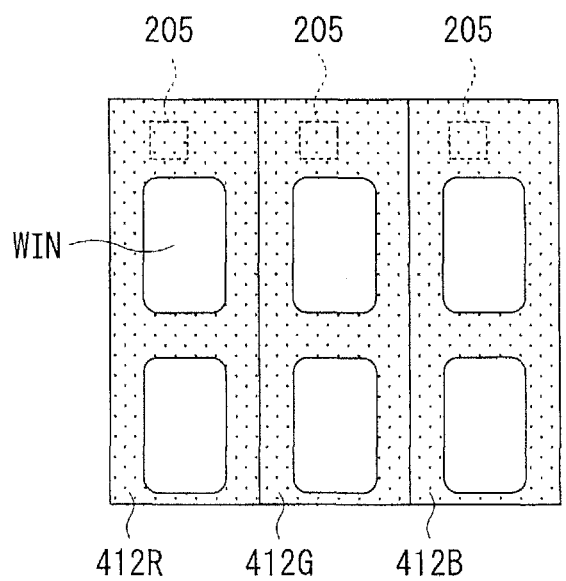
FIG. 30 is a plan view showing an example of an arrangement of windows in the display section illustrated in FIG. 27.

FIG. 30 schematically shows an arrangement of the windows WIN in each of the anodes 412. Each of the anodes 412R, 412G, and 412B is formed away from one another as shown in FIG. 29. However, FIG. 30 illustrates these anodes as if these anodes are placed adjacent to one another for the sake of explanatory convenience. In this example, two windows WIN are arranged side by side in the vertical direction in each of the regions of the anodes 412R, 412G, and 412B. The window WIN has the rectangular shape with rounded corners in this example. As with the above-described embodiment of the present disclosure, at a surrounding area of these windows WIN, there are provided pitched sections PS on the insulating layer 213.

Figure 31:
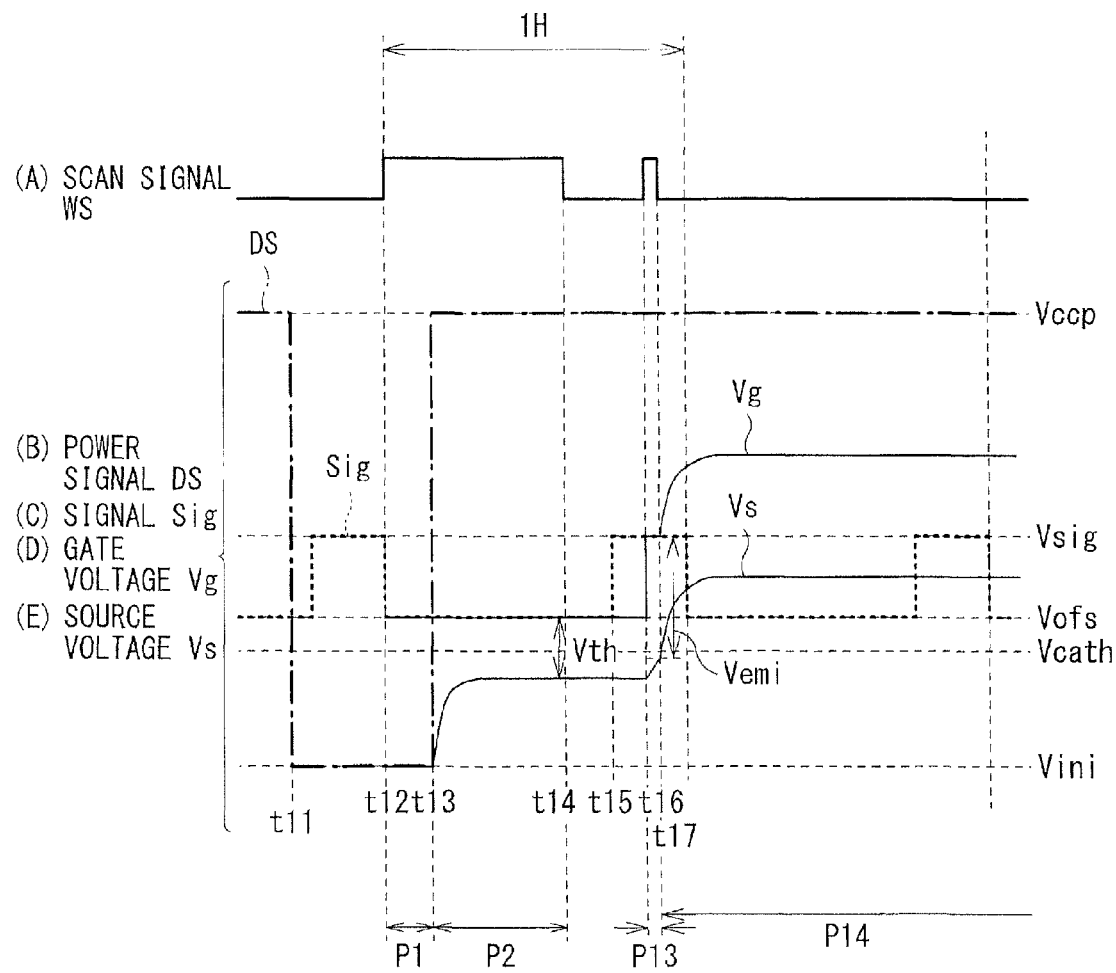
FIG. 31 is a timing waveform chart showing an example of operation of the display unit according to the third embodiment of the present disclosure.

FIG. 31 shows a timing chart for display operation in the display unit 3, wherein (A) shows a waveform of the scan signal WS, (B) shows a waveform of the power signal DS, (C) shows a waveform of the signal Sig, (D) shows a waveform of a gate voltage Vg of the driving transistor DRTr, and (E) shows a waveform of a source voltage Vs of the driving transistor DRTr.

As with the above-described first embodiment, to start with, the driving section 50 initializes the sub-pixels 13 during a timing period of t12 to t13 (initialization period P1), and carries out the Vth correction during a timing period of t13 to t14 (Vth correction period P2).

Next, the scan line driving section 53 changes a voltage of the scan signal WS from a high level to a low level at the timing t14 ((A) of FIG. 31). This turns off the writing transistor WSTr. Further, at a timing t15, the data line driving section 57 sets the signal Sig at the pixel voltage Vsig ((C) of FIG. 31).

Subsequently, the driving section 50 writes the pixel voltage Vsig to the sub-pixels 13, and performs the μ correction during a timing period of t16 to t17 (writing and μ correction period P13). More specifically, the scan line driving section 53 changes a voltage of the scan signal WS from a low level to a high level at the timing t16 ((A) of FIG. 31). As a result, as with the above-described first embodiment, the pixel voltage Vsig is written to the sub-pixels 13, and the μ correction is performed.

Thereafter, the driving section 50 allows the sub-pixels 13 to emit light during a timing period subsequent to the timing t17 (light-emitting period P14). More specifically, at the timing t17, the scan line driving section 53 changes a voltage of the scan signal WS from a high level to a low level ((A) of FIG. 31). As with the above-described first embodiment, this leads to emission of the light-emitting device 19 in the sub-pixel 13.

As described above, even when the pixel is configured using three sub-pixels, it is possible to achieve effects similar to those in the above-described first embodiment.

Modification Example 3-1

Figure 32A:
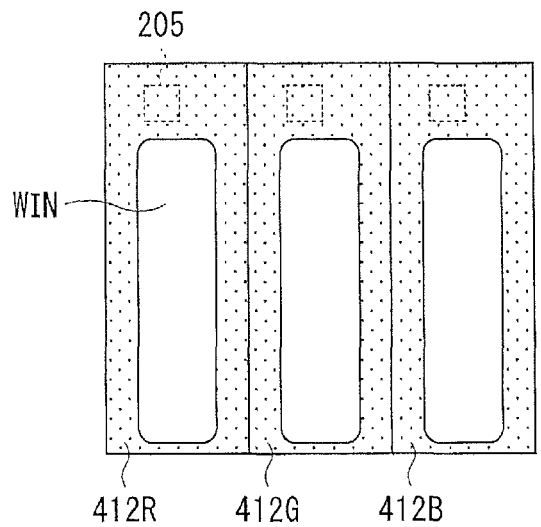
FIG. 32A is a plan view showing an example of an arrangement of windows according to a modification example of the third embodiment of the present disclosure.
Figure 32B:
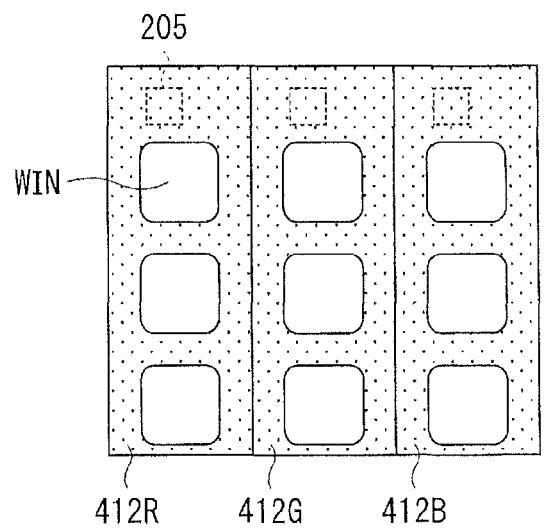
FIG. 32B is a plan view showing an example of an arrangement of windows according to another modification example of the third embodiment of the present disclosure.
Figure 32C:
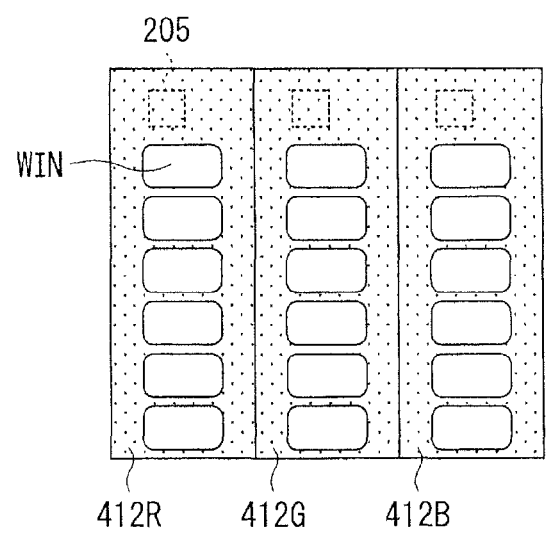
FIG. 32C is a plan view showing an example of an arrangement of windows according to still another modification example of the third embodiment of the present disclosure.

In the above-described embodiment of the present disclosure, two windows WIN are provided in a region of each of the anodes 412. However, an arrangement is not limited thereto, and one window WIN or three or more windows WIN may be provided alternatively as shown in FIGS. 32A to 32C.

Modification Example 3-2

Figure 33:
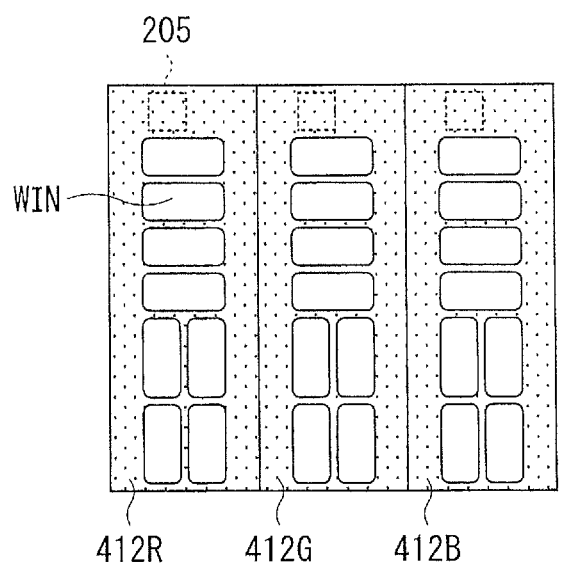
FIG. 33 is a plan view showing an example of an arrangement of windows according to still another modification example of the third embodiment of the present disclosure.
Figure 34:
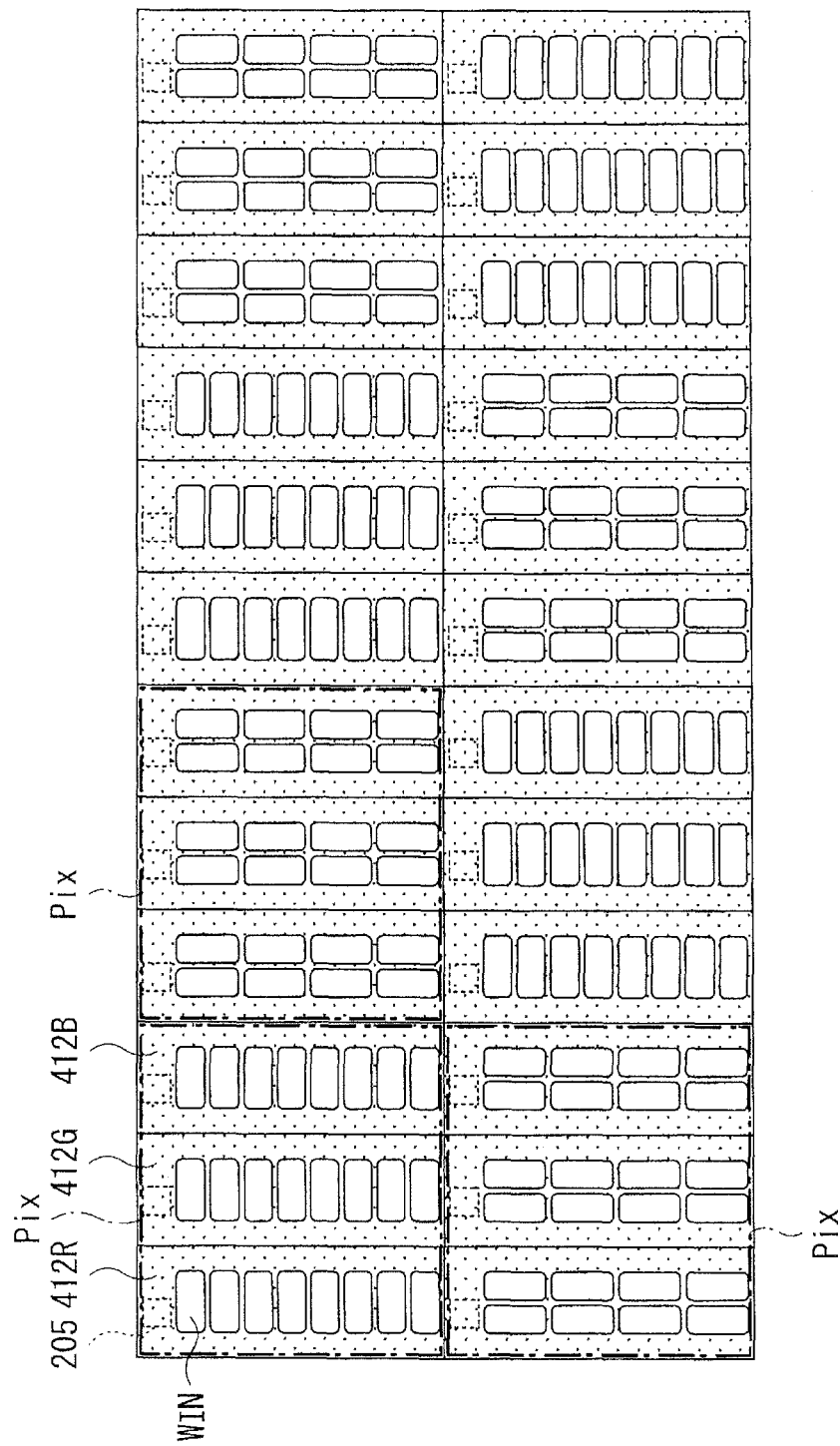
FIG. 34 is a plan view showing an example of an arrangement of windows according to still another modification example of the third embodiment of the present disclosure.

In the above-described embodiment of the present disclosure, all of the windows WIN have the same shapes. However, the configuration is not limited thereto, and the windows WIN may have two different shapes or more. More specifically, for example, as shown in FIG. 33, both of the horizontally-long windows WIN and the vertically-long windows WIN may be provided in each of the anodes 412. Alternatively, for example, as shown in FIG. 34, the plurality of horizontally-long windows WIN may be arranged in a certain pixel Pix, and the plurality of vertically-long windows WIN may be arranged in the pixel Pix that is adjacent to such a pixel Pix in the horizontal direction or in the vertical direction.

Modification Example 3-3

Figure 35:
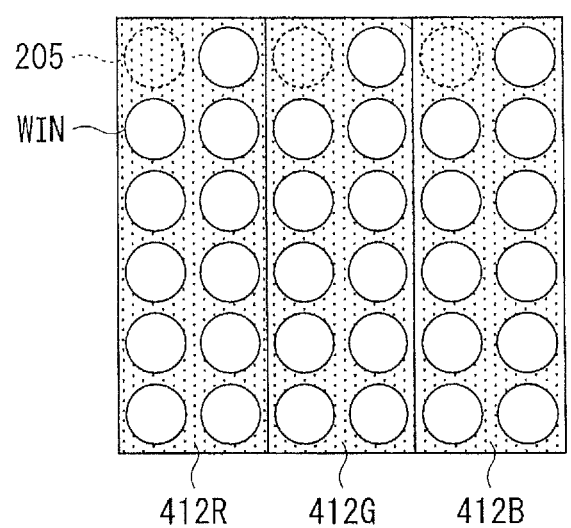
FIG. 35 is a plan view showing an example of an arrangement of windows according to still another modification example of the third embodiment of the present disclosure.
Figure 36A:
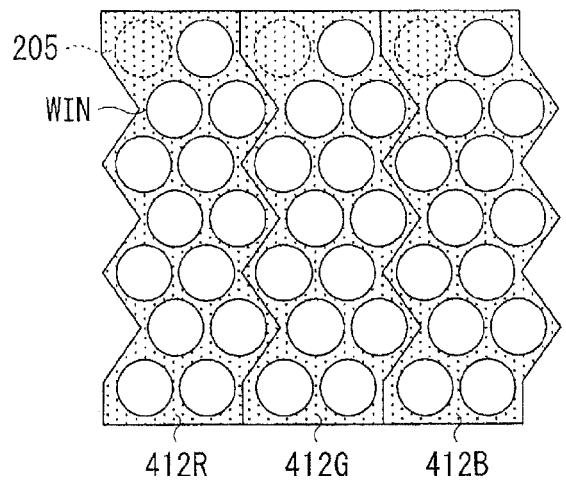
FIG. 36A is a plan view showing an example of an arrangement of windows according to still another modification example of the third embodiment of the present disclosure.
Figure 36B:
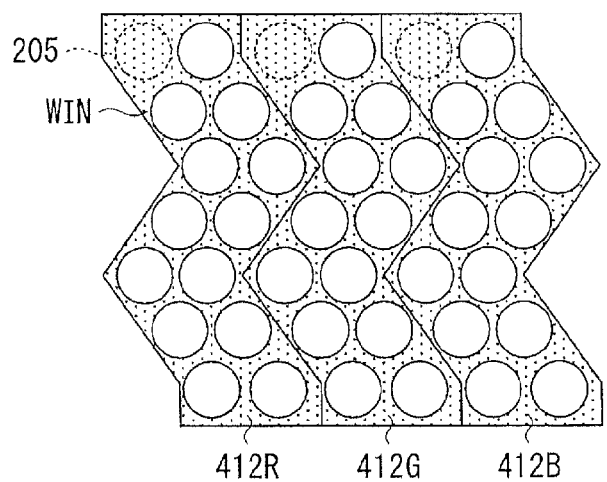
FIG. 36B is a plan view showing an example of an arrangement of windows according to still another modification example of the third embodiment of the present disclosure.
Figure 36C:
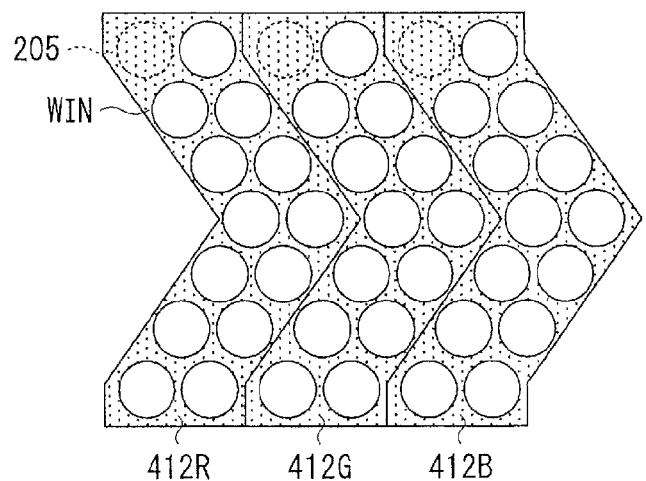
FIG. 36C is a plan view showing an example of an arrangement of windows according to still another modification example of the third embodiment of the present disclosure.

In the above-described embodiment of the present disclosure, the contact 205 and the window WIN are different from each other in the shape. However, the shapes are not limited thereto, and for example, the contact 205 and the window WIN may be almost the same in the shape and size as shown in FIG. 35. In this example, each of the contact 205 and the window WIN takes the circular shape. In this case, it is possible to arrange the contacts 205 and the windows WIN in a limited area more effectively. Alternatively, as shown in FIGS. 36A to 36C, the contacts 205 and the windows WIN may be arranged in the so-called close-packed arrangement. In such a case, each side that configures a contour of the anode 412 is provided at a gap between the contact 205 and the window WIN. Consequently, in this example, a top side and a bottom side of the anode 412 extend in the traverse direction, but each of a plurality of left sides and a plurality of right sides extend in the direction corresponding to the arrangement of the contact 205 and the window WIN.

4. Application Examples

Next, description is provided on application examples of the display units that are described in the above-described embodiments and the modification examples thereof of the present disclosure.

Figure 37:
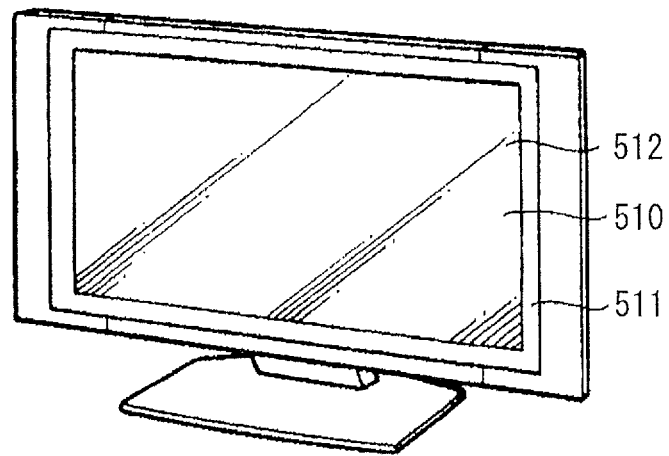
FIG. 37 is a perspective view showing a configuration of an appearance of a television apparatus to which any of the display units according to the embodiments of the present disclosure is applied.

FIG. 37 shows an appearance of a television apparatus to which any of the display units according to the above-described embodiments and the like of the present disclosure is applicable. This television apparatus may have, for example, an image display screen section 510 including a front panel 511 and a filter glass 512, and this image display screen section 510 is configured of any of the display units according to the above-described embodiments and the like of the present disclosure.

The display units according to the above-described embodiments and the like of the present disclosure are applicable to electronic apparatuses in every field, such as a digital camera, a notebook personal computer, a mobile terminal apparatus including a mobile phone, a portable game machine, or a video camera in addition to such a television apparatus. In other words, the display units according to the above-described embodiments and the like of the present disclosure are applicable to electronic apparatuses in every field that display images.

The present technology is described thus far with reference to some embodiments and modification examples as well as the application examples for electronic apparatuses. However, the present technology is not limited to the above-described embodiments and the like, and various modifications may be made.

Figure 38:
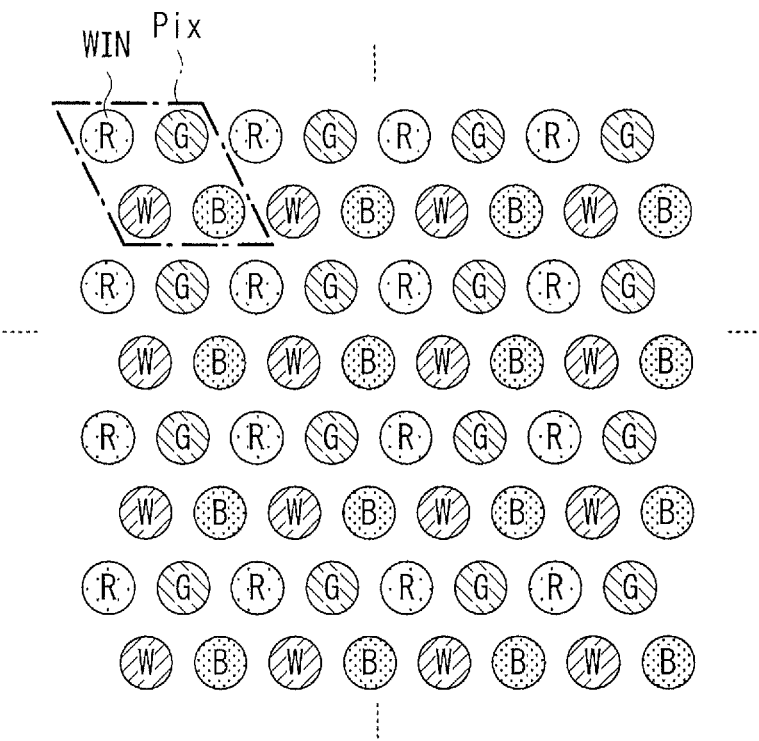
FIG. 38 is a plan view showing an example of an arrangement of windows according to a modification example.
Figure 39:
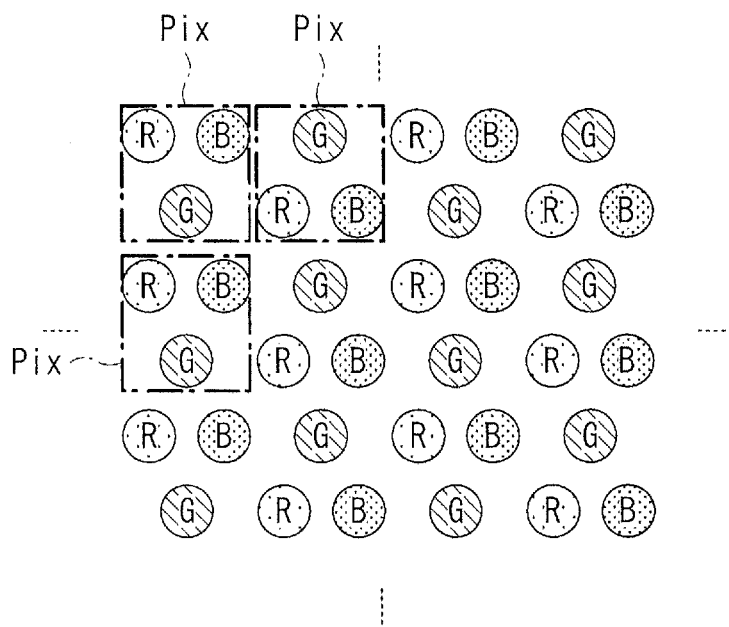
FIG. 39 is a plan view showing an example of an arrangement of windows according to another modification example.

For example, when one window WIN is provided in each of the sub-pixels, the windows WIN may be arranged as shown in FIGS. 38 and 39. In FIG. 38, the pixel Pix is configured of four sub-pixels of red (R), green (G), blue (B), and white (W).

In FIG. 39, the pixel Pix is configured of three sub-pixels of red (R), green (G), and blue (B).

Further, for example, in each of the above-described embodiments and the like, each of the writing transistor WSTr and the driving transistor DRTr is configured of an NMOS. However, the configuration is not limited thereto, and either one or both of these transistors may be configured of a PMOS alternatively.

Figure 40:
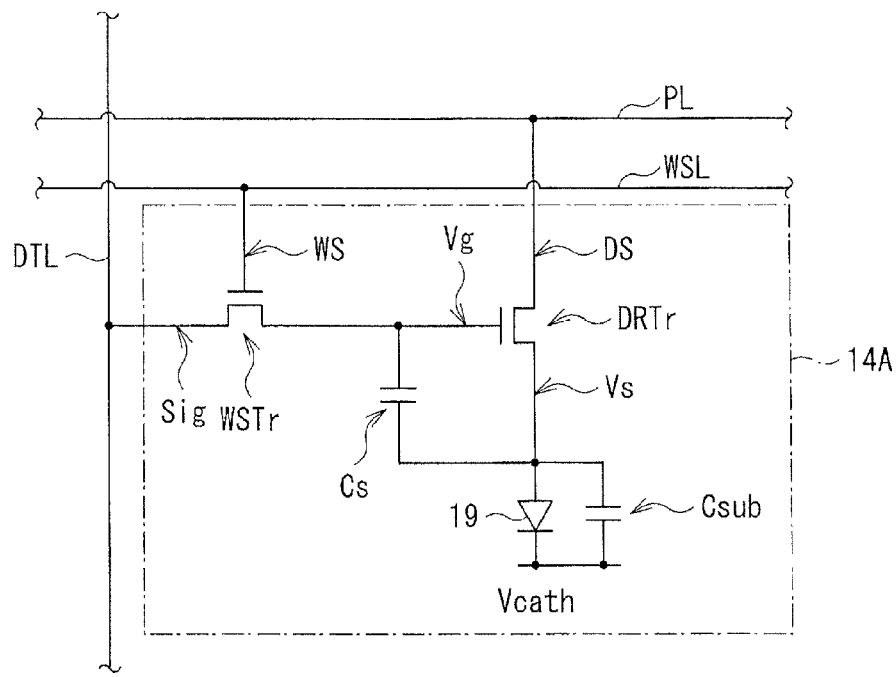
FIG. 40 is a circuit diagram showing an example of a configuration of a sub-pixel according to another modification example.
Figure 41:
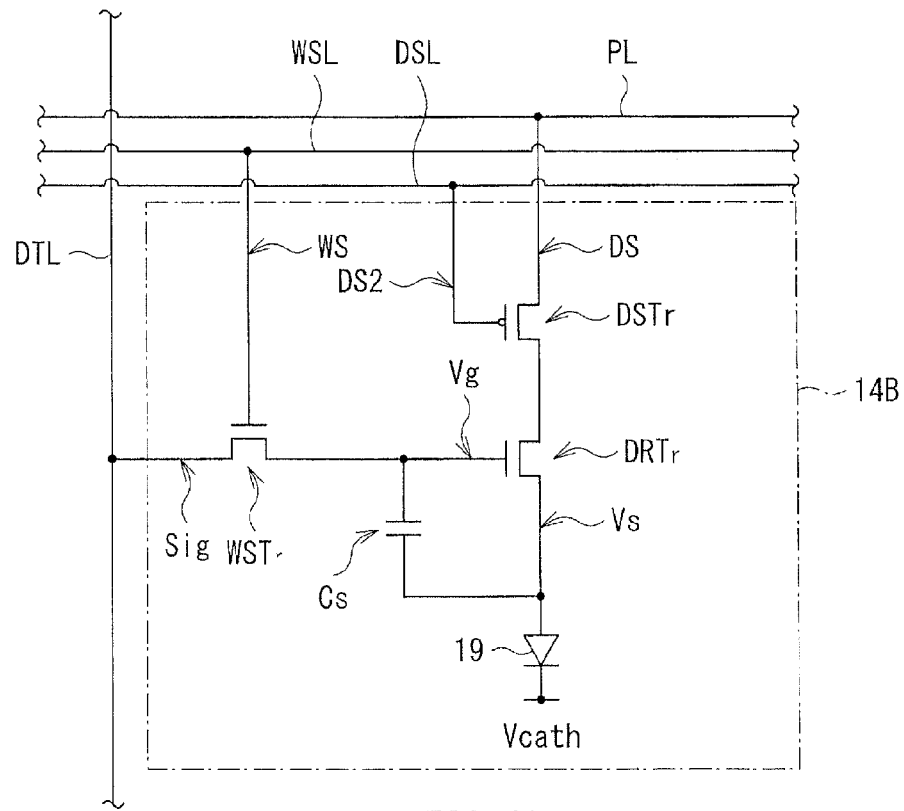
FIG. 41 is a circuit diagram showing an example of a configuration of a sub-pixel according to still another modification example.

Further, for example, in each of the above-described embodiments and the like, the sub-pixel adopts a so-called "2Tr1C" configuration. However, the configuration is not limited thereto, and the sub-pixel may be configured by adding any other device. More specifically, for example, like a sub-pixel 14A illustrated in FIG. 40, a so-called "2Tr2C" configuration may be adopted that provides a capacitor Csub to be connected in parallel with the light-emitting device 19. Alternatively, for example, like a sub-pixel 14B illustrated in FIG. 41, a so-called "3Tr1C" configuration may be adopted that provides a power transistor DSTr for controlling supply of the power signal DS to the driving transistor DRTr.

Moreover, for example, in each of the above-described embodiments and the like, the so-called top-emission type light-emitting device 19 is used. However, a type of the light-emitting device is not limited thereto, and for example, a so-called bottom-emission type light-emitting device may be alternatively used where the light emitted from the light-emitting layer 214 travels in a direction of the substrate 200 that is a support substrate.

Further, for example, in each of the above-described embodiments and the like, the display unit has organic EL display devices. However, the display unit is not limited thereto, and any display unit may be used if they have current-drive type display devices.

It is possible to achieve at least the following configurations from the above-described example embodiments and the modifications of the disclosure.

(1) A display unit, including a pixel including a plurality of sub-pixels, the sub-pixels each including a plurality of light emission regions that are arranged away from one another,
each of the sub-pixels including
a single first electrode,
a single second electrode provided in a lamination direction of the first electrode, and
a light-emitting layer inserted between the first electrode and the second electrode in each of the light emission regions.
(2) The display unit according to (1), wherein
each of the sub-pixels includes a first insulating layer on the first electrode, the first insulating layer having a plurality of windows in correspondence with the light emission regions, and
the first electrode, the light-emitting layer, and the second electrode are laminated in order at least at bottom of each of the windows.
(3) The display unit according to (2), wherein
each of the sub-pixels includes a second insulating layer that is formed to cover a whole region of the sub-pixel and that has a refractive index different from a refractive index of the first insulating layer, and
following Expressions (1) and (2) are satisfied, $$1.1 \leq n1 \leq 1.8 \tag{1}$$

$$n1-n2 \geq 0.20 \tag{2}$$

where n1 is the refractive index of the second insulating layer, and
n2 is the refractive index of the first insulating layer.

(4) The display unit according to (2), wherein the window of the first insulating layer has a truncated conical shape, and
following Expressions (3) and (4) are satisfied, $$0.5 \leq R1/R2 \leq 0.8 \tag{3}$$

$$0.5 \leq H/R1 \leq 2.0 \tag{4}$$

where H is a height of the first insulating layer, R1 is a window diameter at the bottom of the window, and R2 is a window diameter at a top end of the first insulating layer.
(5) The display unit according to any one of (1) to (4), wherein each of the light emission regions has one of a circular shape and an elliptical shape.
(6) The display unit according to (5), wherein each of the sub-pixels includes two the light emission regions having elliptical shapes that have major axis directions different from each other.
(7) The display unit according to (5) or (6), wherein
each of the sub-pixels includes three or more the light emission regions, and
all or a part of the light emission regions belonging to one pixel are arranged to allow three light emission regions out of the all or the part of the light emission regions to be adjacent to one another.
(8) The display unit according to (7), wherein the first electrode has a hexagonal shape.
(9) The display unit according to (8), wherein
a pair of facing sides out of six sides of the first electrode have lengths that are equal to each other,
four sides other than the pair of sides have lengths that are equal to one another, and
the lengths of the pair of sides are longer than the lengths of the other four sides.
(10) The display unit according to (9), further including a signal line extending in a first direction, wherein
the pair of sides extend in a second direction intersecting with the first direction.
(11) The display unit according to any one of (8) to (10), wherein
the pixel includes four the sub-pixels, and
four the first electrodes in the four sub-pixels are arranged to allow three the first electrodes out of the four first electrodes to be adjacent to one another.
(12) The display unit according to (7), wherein
all of the light emission regions belonging to one sub-pixel are arranged to allow three light emission regions out of all of the light emission regions to be adjacent to one another, and
the first electrode has a polygonal shape corresponding to an arrangement of the light emission regions in the one sub-pixel.
(13) The display unit according to (12), wherein the pixel has three or four the sub-pixels.
(14) The display unit according to any one of (1) to (4), wherein the plurality of light emission regions each have a quadrilateral shape.
(15) The display unit according to (14), wherein the light emission region has a rectangular shape, and
each of the sub-pixels includes two light emission regions that have long-side directions different from each other.
(16) The display unit according to (14), including a plurality of the pixels, wherein
the light emission region has a rectangular shape, and
the light emission region in one of the pixels has a long-side direction that is different from a long-side direction of the light emission region in another pixel adjacent to the one of the pixels.

(17) The display unit according to any one of (1) to (16), further including:
a plurality of the pixels; and
a signal line extending in a first direction, wherein
each of the sub-pixels further includes a pixel circuit that is formed in a pixel circuit region, and
the pixel circuit regions are provided side by side in the first direction and a second direction intersecting with the first direction.
(18) The display unit according to any one of (1) to (17), wherein the second electrodes in the sub-pixels are connected with one another.
(19) An electronic apparatus provided with a display unit and a control section configured to control operation of the display unit, the display unit including a pixel including a plurality of sub-pixels, the sub-pixels each including a plurality of light emission regions that are arranged away from one another,
each of the sub-pixels including
a single first electrode,
a single second electrode provided in a lamination direction of the first electrode, and
a light-emitting layer inserted between the first electrode and the second electrode in each of the light emission regions.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit, comprising a pixel including a plurality of sub-pixels, the sub-pixels each including a plurality of light emission regions that are arranged away from one another,
each of the sub-pixels including
a single first electrode,
a single second electrode, the first electrode and the second electrode being arranged in a lamination direction,
a light-emitting layer inserted between the first electrode and the second electrode in each of the light emission regions, and
a first insulating layer on the first electrode,
wherein the first insulating layer includes a plurality of windows in both a first direction and a second direction, respectively corresponding to the plurality of light emission regions.

2. The display unit according to claim 1, wherein
the first electrode, the light-emitting layer, and the second electrode are arranged in the lamination direction in order at least at bottom of each of the windows.

3. The display unit according to claim 2, wherein
each of the sub-pixels includes a second insulating layer that is formed to cover a whole region of the sub-pixel and that has a refractive index different from a refractive index of the first insulating layer, and
following Expressions (1) and (2) are satisfied, $$1.1 \le n1 \le 1.8 \quad (1)$$

$$n1-n2 \ge 0.20 \quad (2)$$

where n1 is the refractive index of the second insulating layer, and
n2 is the refractive index of the first insulating layer.

4. The display unit according to claim 2, wherein a respective window of the first insulating layer has a truncated conical shape, and
following Expressions (3) and (4) are satisfied, $$0.5 \le R1/R2 \le 0.8 \quad (3)$$

$$0.5 \le H/R1 \le 2.0 \quad (4)$$

where H is a height of the first insulating layer, R1 is a window diameter at the bottom of the window, and R2 is a window diameter at a top end of the first insulating layer.

5. The display unit according to claim 1, wherein each of the light emission regions has one of a circular shape and an elliptical shape.

6. The display unit according to claim 5, wherein each of the sub-pixels includes two of the light emission regions having elliptical shapes that have major axis directions different from each other.

7. The display unit according to claim 5, wherein
each of the sub-pixels includes three or more of the light emission regions, and
all or a part of the light emission regions belonging to one pixel are arranged to allow three light emission regions out of the all or the part of the light emission regions to be adjacent to one another.

8. The display unit according to claim 7, wherein the first electrode has a hexagonal shape.

9. The display unit according to claim 8, wherein
a pair of facing sides out of six sides of the first electrode have lengths that are equal to each other,
four sides other than the pair of sides have lengths that are equal to one another, and
the lengths of the pair of sides are longer than the lengths of the other four sides.

10. The display unit according to claim 9, further comprising a signal line extending in a third direction, wherein
the pair of sides extend in a fourth direction intersecting with the third direction.

11. The display unit according to claim 8, wherein
the pixel includes four of the sub-pixels, and
four of the first electrodes, each respectively in one of the four sub-pixels, that are arranged to allow three of the first electrodes out of the four first electrodes to be adjacent to one another.

12. The display unit according to claim 7, wherein
all of the light emission regions belonging to one sub-pixel are arranged to allow three light emission regions out of all of the light emission regions to be adjacent to one another, and
the first electrode has a polygonal shape corresponding to an arrangement of the light emission regions in the one sub-pixel.

13. The display unit according to claim 12, wherein the pixel has three or four of the sub-pixels.

14. The display unit according to claim 1, wherein the plurality of light emission regions each have a quadrilateral shape.

15. The display unit according to claim 14, wherein
the light emission region has a rectangular shape, and
each of the sub-pixels includes two light emission regions that have long-side directions different from each other.

16. The display unit according to claim 14, comprising a plurality of the pixels, wherein
the light emission region has a rectangular shape, and
the light emission region in one of the pixels has a long-side direction that is different from a long-side direction of the light emission region in another pixel adjacent to the one of the pixels.

17. The display unit according to claim 1, further comprising:
a plurality of the pixels; and a signal line extending in a third direction, wherein
each of the sub-pixels further includes a pixel circuit that is formed in a pixel circuit region, and
the pixel circuit regions are provided side by side in the third direction and a fourth direction intersecting with the third direction.

18. The display unit according to claim 1, wherein the second electrodes in the sub-pixels are connected with one another.

19. An electronic apparatus provided with a display unit and a control section configured to control operation of the display unit, the display unit comprising a pixel including a plurality of sub-pixels, the sub-pixels each including a plurality of light emission regions that are arranged away from one another,
each of the sub-pixels including
a single first electrode,
a single second electrode, the first electrode and the second electrode being arranged in a lamination direction,
a light-emitting layer inserted between the first electrode and the second electrode in each of the light emission regions, and
a first insulating layer on the first electrode,
wherein the first insulating layer includes a plurality of windows in both a first direction and a second direction, respectively corresponding to the plurality of light emission regions.

* * * * *